US012812931B2

(12) United States Patent
Chen et al.

(10) Patent No.: US 12,812,931 B2
(45) Date of Patent: Nov. 24, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Hong-Chih Chen, Hsinchu (TW); Je-Wei Hsu, Hsinchu (TW); Ting-Huan Hsieh, Hsinchu (TW); Chia-Hao Kuo, Hsinchu (TW); Fu-Hsiang Su, Hsinchu (TW); Shih-Hsun Chang, Hsinchu (TW); Ping-Chun Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 596 days.

(21) Appl. No.: 18/135,598

(22) Filed: Apr. 17, 2023

(65) Prior Publication Data

US 2024/0347592 A1 Oct. 17, 2024

(51) Int. Cl.

| | |
|---|---|
| ***H10D 30/43*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/013* (2025.01); *H10D 84/038* (2025.01); *H10D 84/85* (2025.01)

(58) Field of Classification Search

CPC .. H10D 30/014; H10D 30/43; H10D 30/6735; H10D 30/6757; H10D 30/0212; H10D 62/121; H10D 64/017; H10D 84/013; H10D 84/038; H10D 84/85

See application file for complete search history.

(56) References Cited

U.S. PATENT DOCUMENTS

| | | | | |
|---|---|---|---|---|
| 9,443,769 | B2 * | 9/2016 | Wang | H10D 30/0212 |
| 10,332,789 | B2 * | 6/2019 | Chou | H10D 30/62 |
| 10,930,753 | B2 | 2/2021 | Hattendorf et al. | |
| 2017/0117411 | A1 * | 4/2017 | Kim | H10B 10/12 |
| 2018/0151683 | A1 * | 5/2018 | Yeo | H10D 30/6211 |
| 2019/0164966 | A1 * | 5/2019 | Wang | H10D 84/853 |

(Continued)

*Primary Examiner* — Omar F Mojaddedi

(74) *Attorney, Agent, or Firm* — NZ Carr Law Office

(57) ABSTRACT

Embodiments of the present disclosure provide semiconductor device structures and methods of forming the same. The structure includes a source/drain region disposed over a substrate, a first interlayer dielectric layer surrounding a first portion of the source/drain region, a second interlayer dielectric layer distinct from the first interlayer dielectric layer surrounding a second portion of the source/drain region, a silicide layer disposed on the source/drain region, and a conductive contact disposed over the source/drain region. The conductive contact is disposed in the second interlayer dielectric layer.

20 Claims, 27 Drawing Sheets

(56) References Cited

U.S. PATENT DOCUMENTS

| | | | | |
|---|---|---|---|---|
| 2021/0193816 | A1* | 6/2021 | Chu | H10D 30/0212 |
| 2022/0052169 | A1* | 2/2022 | More | H10D 30/024 |
| 2023/0067696 | A1 | 3/2023 | Huang et al. | |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-10A are cross-sectional side views of various stages of manufacturing the semiconductor device structure taken along line A-A of FIG. 6, in accordance with some embodiments.

FIGS. 7B-10B are cross-sectional side views of various stages of manufacturing the semiconductor device structure taken along line B-B of FIG. 6, in accordance with some embodiments.

FIGS. 7C-10C are cross-sectional side views of various stages of manufacturing the semiconductor device structure taken along line C-C of FIG. 6, in accordance with some embodiments.

FIGS. 11A-12A are perspective views of various stages of manufacturing the semiconductor device structure, in accordance with some embodiments.

FIGS. 11B-12B are cross-sectional side views of various stages of manufacturing the semiconductor device structure taken along line C-C of FIG. 6, in accordance with some embodiments.

FIGS. 17A-19A are cross-sectional side views of various stages of manufacturing the semiconductor device structure taken along line A-A of FIG. 6, in accordance with some embodiments.

FIGS. 17B-19B are cross-sectional side views of various stages of manufacturing the semiconductor device structure taken along line B-B of FIG. 6, in accordance with some embodiments.

FIGS. 17C-19C are cross-sectional side views of various stages of manufacturing the semiconductor device structure taken along line C-C of FIG. 6, in accordance with some embodiments.

FIGS. 20A-23A are cross-sectional side views of various stages of manufacturing the semiconductor device structure taken along line A-A of FIG. 6, in accordance with some embodiments.

FIGS. 20B-23B are cross-sectional side views of various stages of manufacturing the semiconductor device structure taken along line B-B of FIG. 6, in accordance with some embodiments.

FIGS. 24A-25A are cross-sectional side views of various stages of manufacturing the semiconductor device structure taken along line A-A of FIG. 6, in accordance with alternative embodiments.

FIGS. 24B-25B are cross-sectional side views of various stages of manufacturing the semiconductor device structure taken along line B-B of FIG. 6, in accordance with alternative embodiments.

FIGS. 24C-25C are cross-sectional side views of various stages of manufacturing the semiconductor device structure taken along line C-C of FIG. 6, in accordance with alternative embodiments.

DETAILED DESCRIPTION

Figure 1:
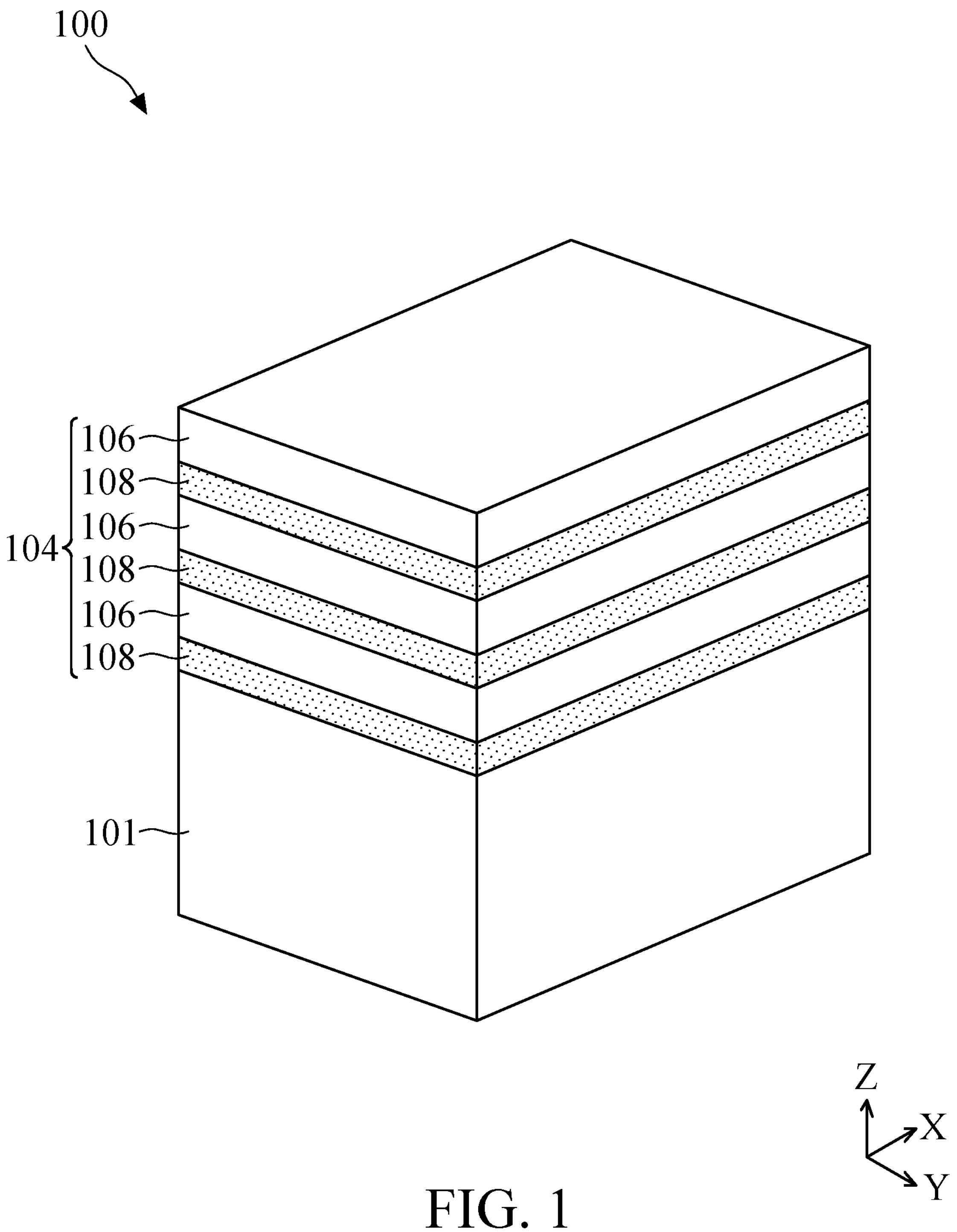
FIGS. 1-6 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having power network moved from the front-side to the backside. As a result, the routing resource for both backside power and front-side signal is relaxed.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA)

FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-27B show exemplary processes for manufacturing a semiconductor device structure 100 according to embodiments of the present disclosure. It is understood that additional operations can be provided before, during, and after processes shown by FIGS. 1-27B, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
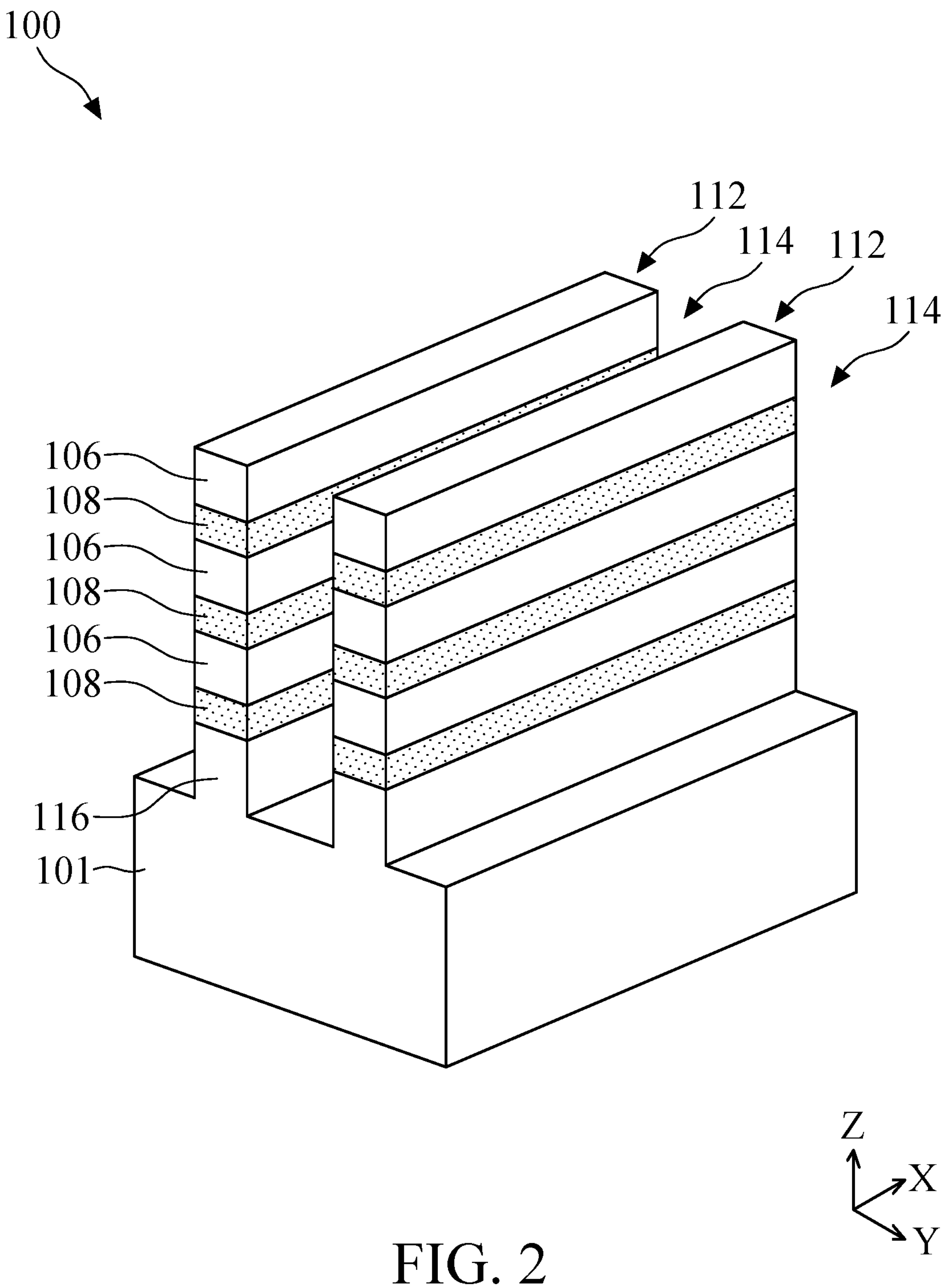

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photolithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
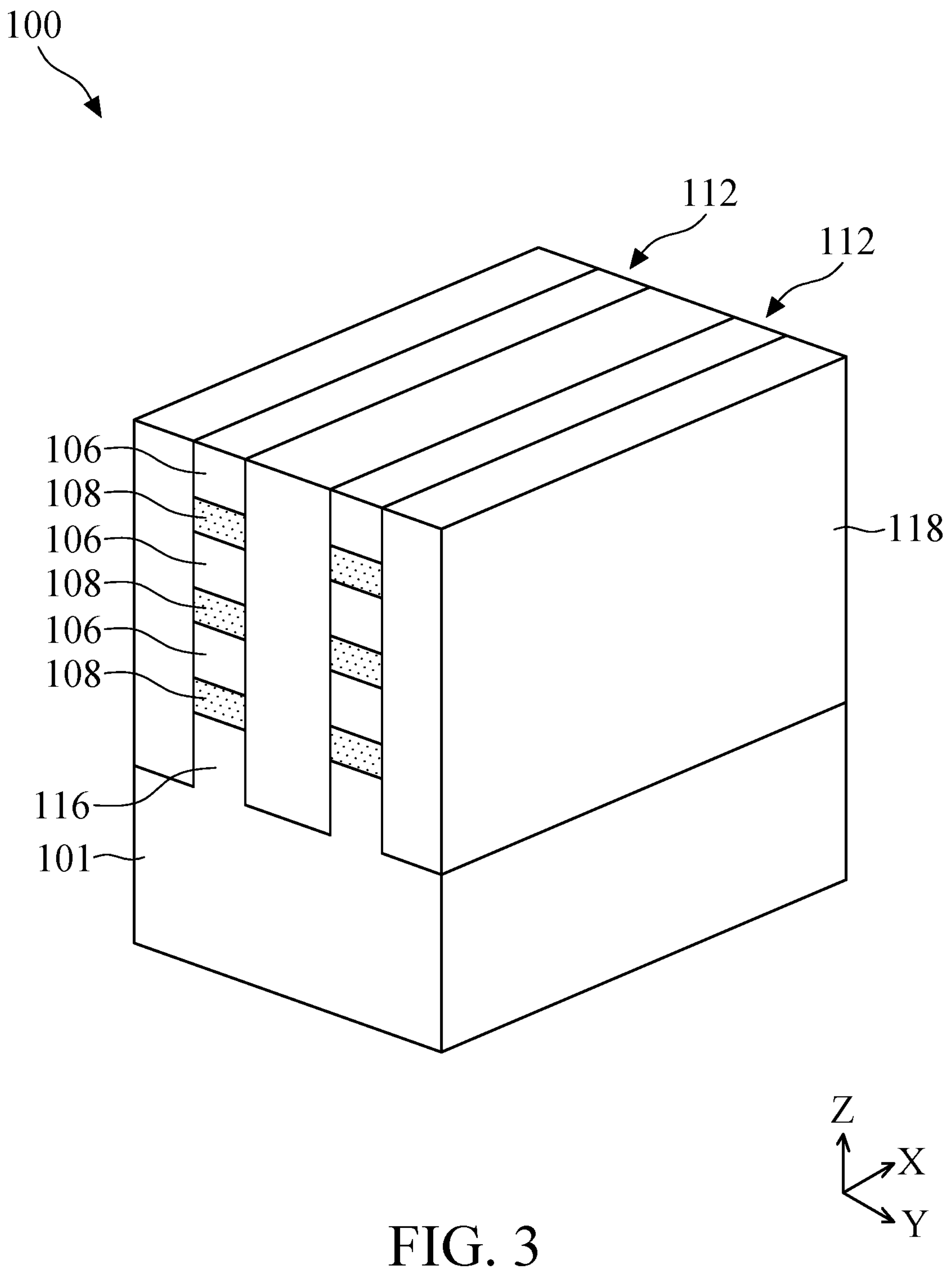

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
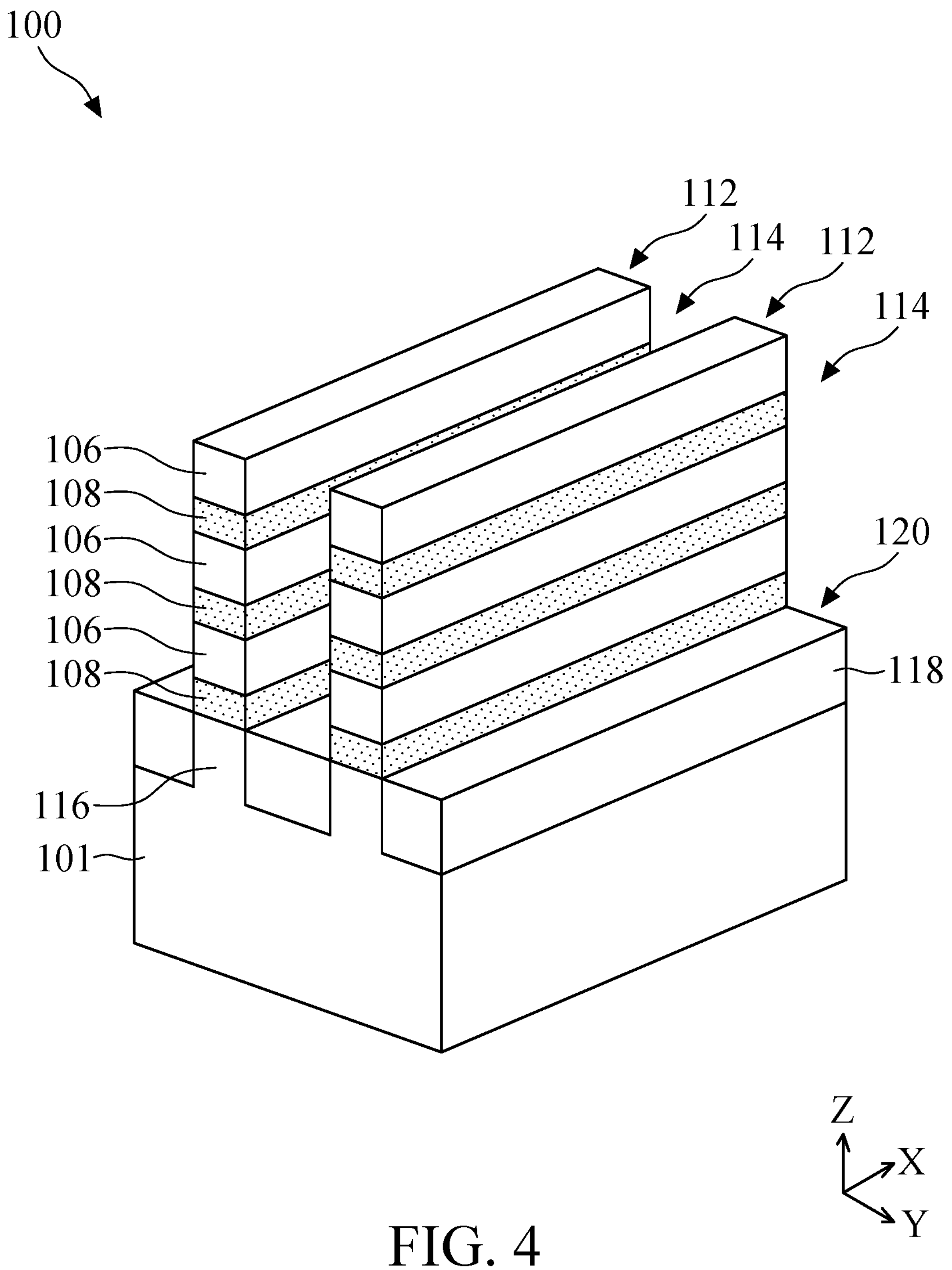

In FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
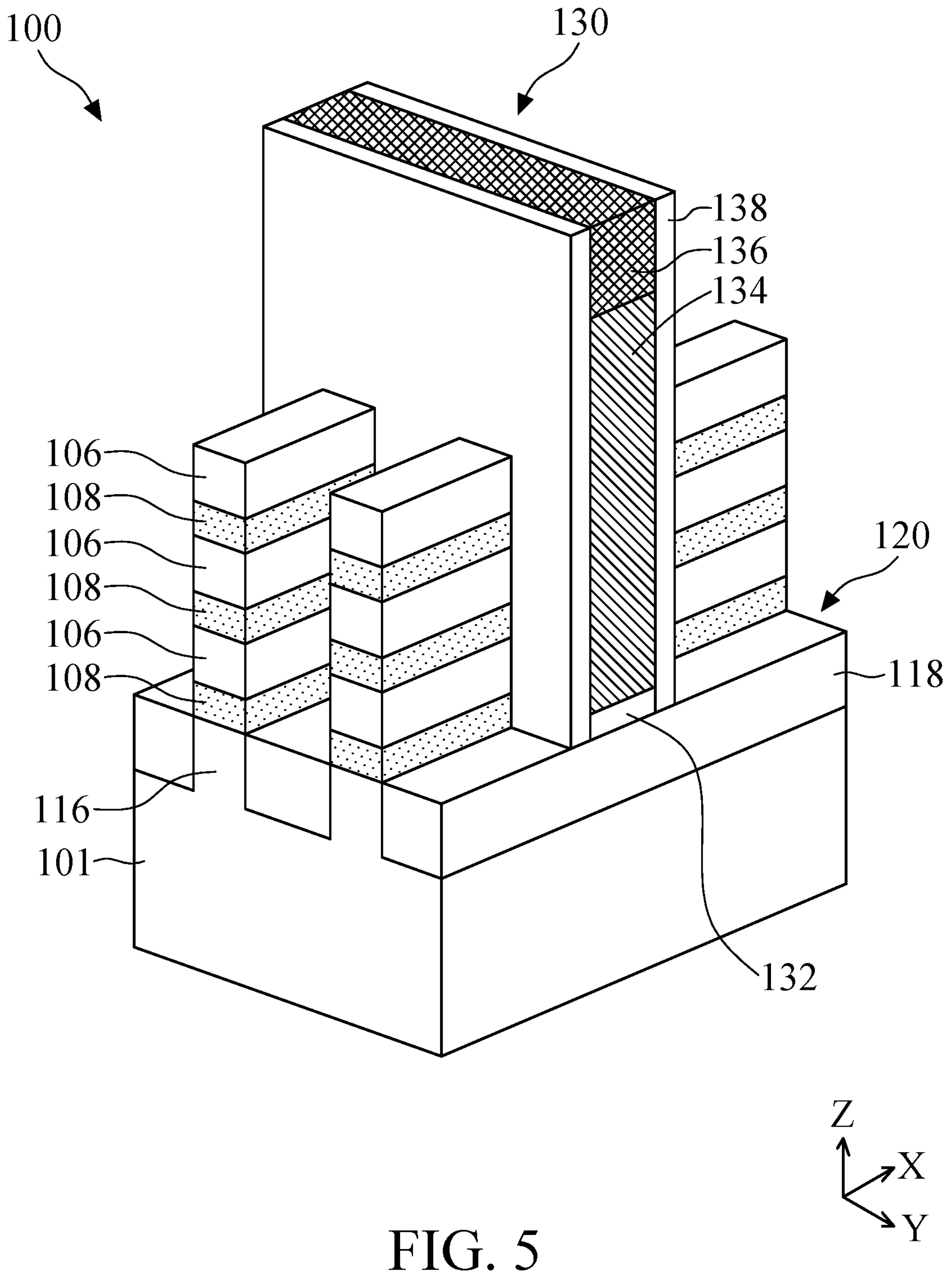

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100.

Figure 6:
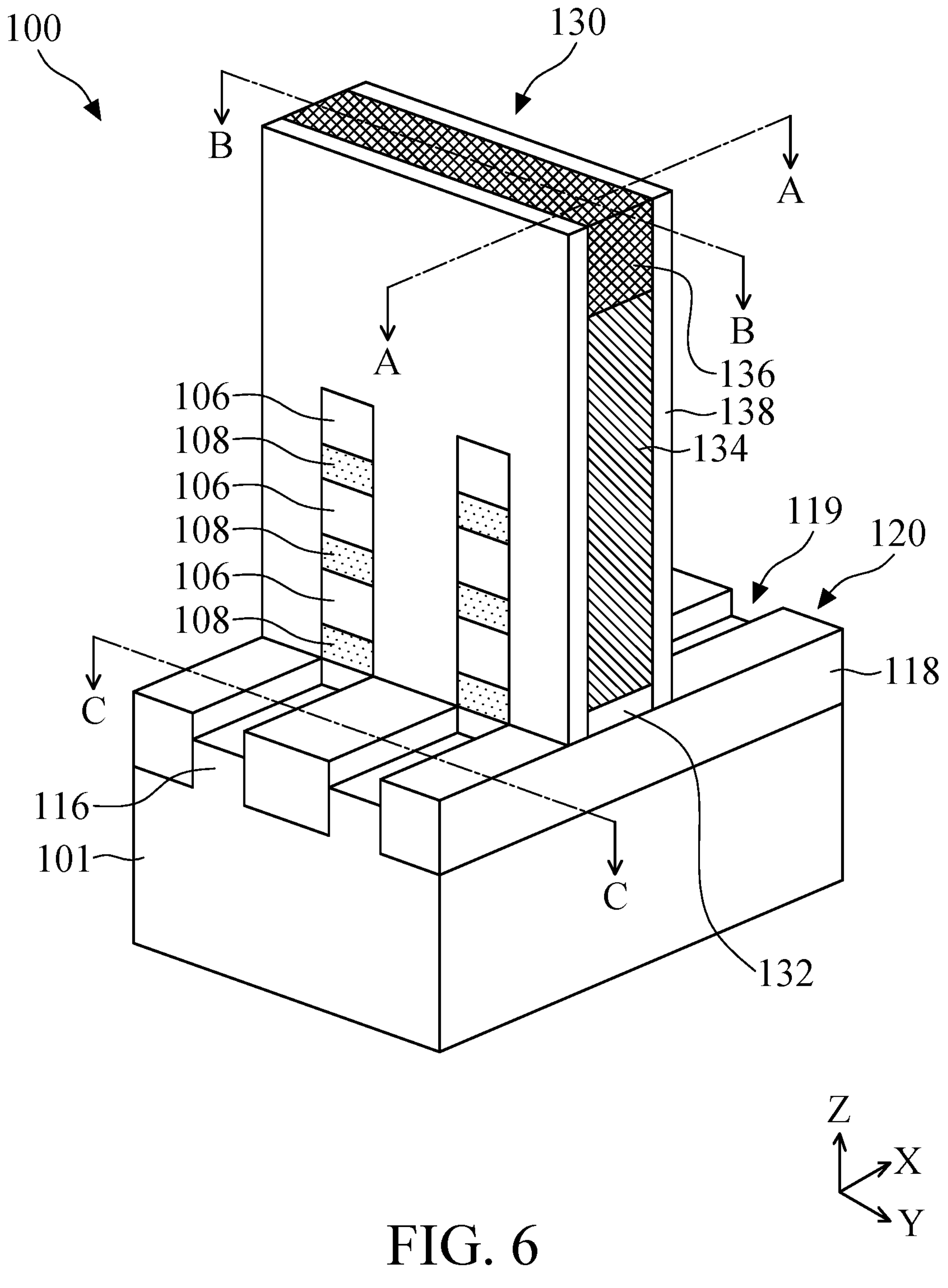

In FIG. 6, the portions of the fin structures 112 not covered by the sacrificial gate structure 130 and the gate spacers 138 are recessed to a level above, at, or below the top surfaces of the isolation regions 120. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide ($NH_4OH$), or any suitable etchant.

Figure 7A:
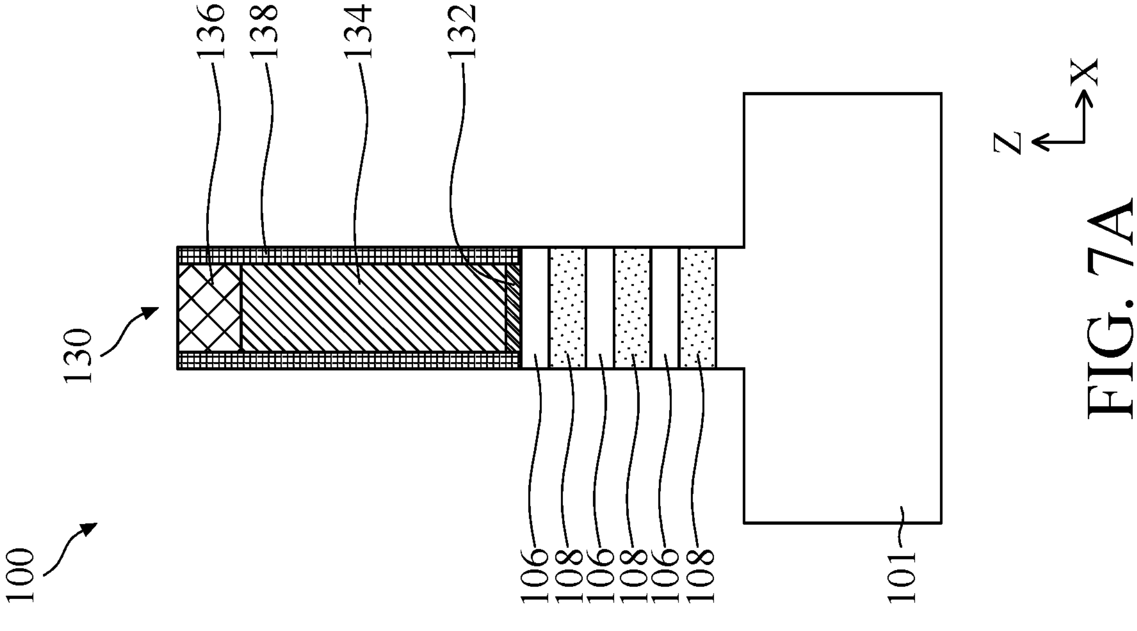
Figure 7B:
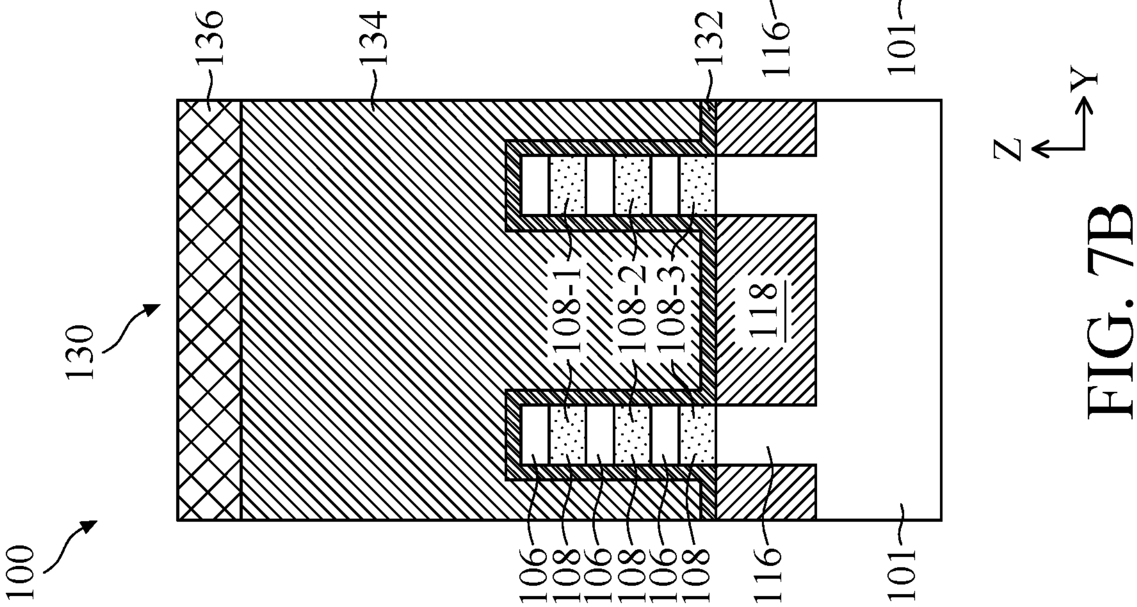
Figure 7C:
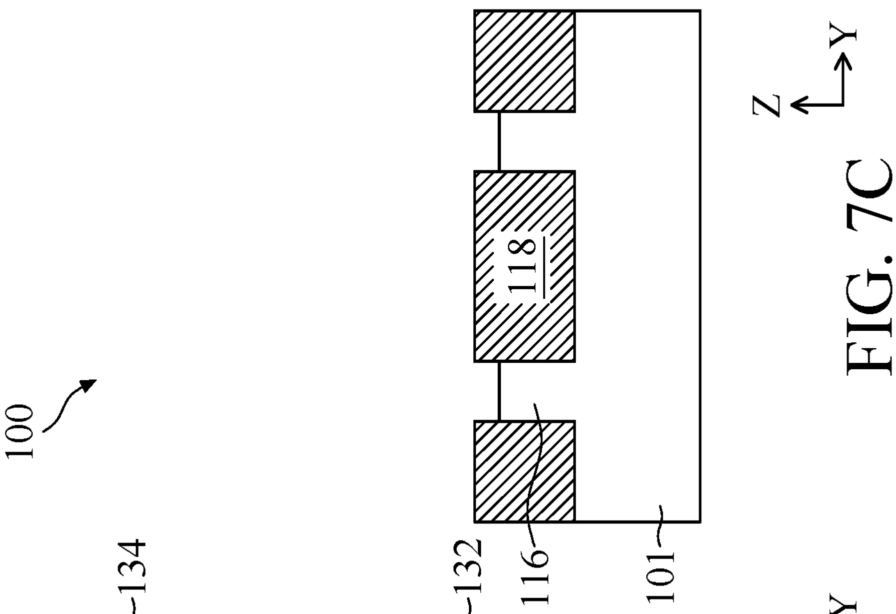

FIGS. 7A, 7B, and 7C are cross-sectional side views of the semiconductor device structure 100 taken along line A-A, line B-B, and line C-C of FIG. 6, respectively.

Figures 8A, 8B, 8C:
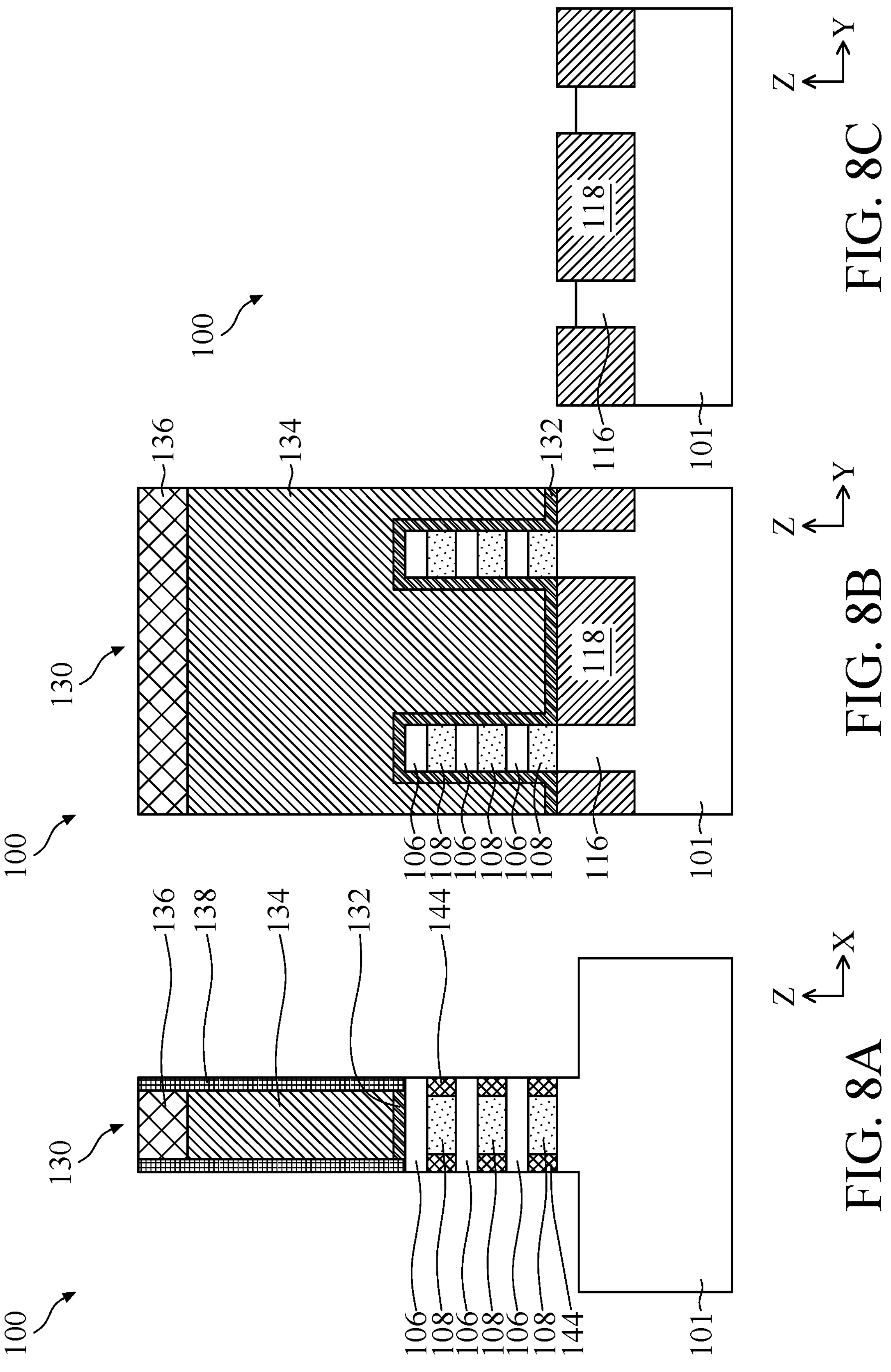

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 9C:
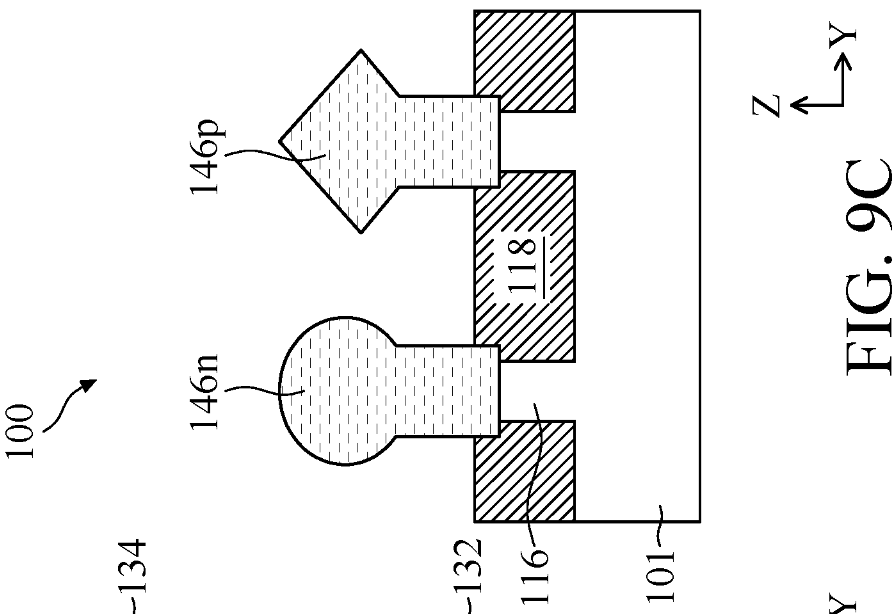
Figure 9B:
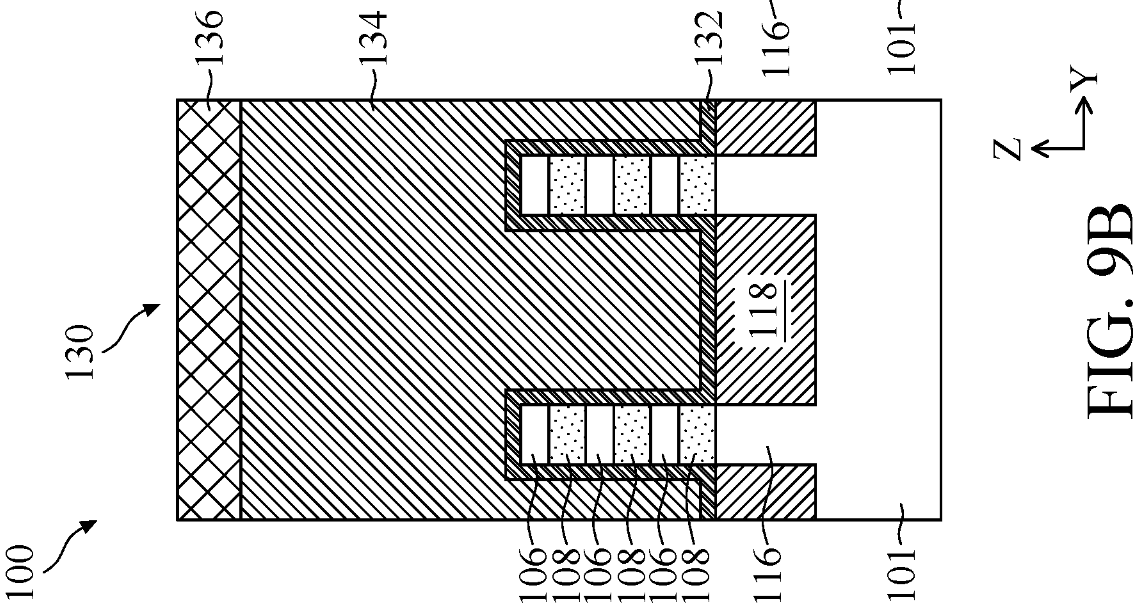
Figure 9A:
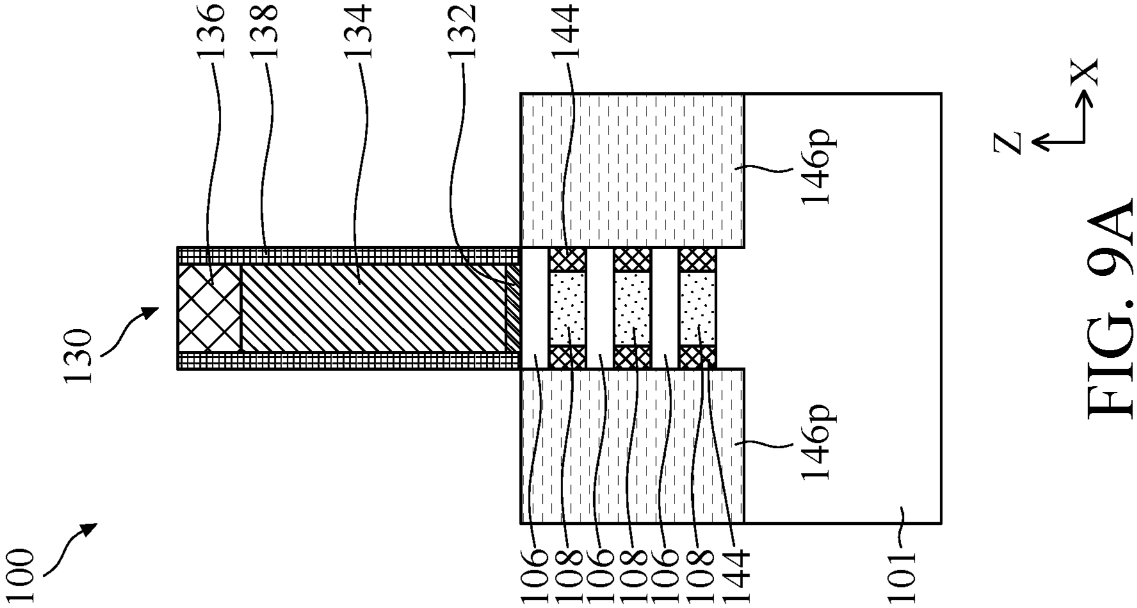

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, source/drain (S/D) regions 146*n*, 146*p* are formed from the well portion 116. In some embodiments, the S/D regions 146*p* may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 146*n* may be made of one or more layers of Si, SiP, SiC and SiCP for n-channel FETs, and the S/D regions 146*p* may be made of one or more layers of Si, SiGe, Ge for p-channel FETs. For p-channel FETs, p-type dopants, such as boron (B), may also be included in the S/D regions 146*p*. The S/D regions 146*n*, 146*p* may be formed by an epitaxial growth method using CVD, ALD or MBE.

Figures 10A, 10B, 10C:
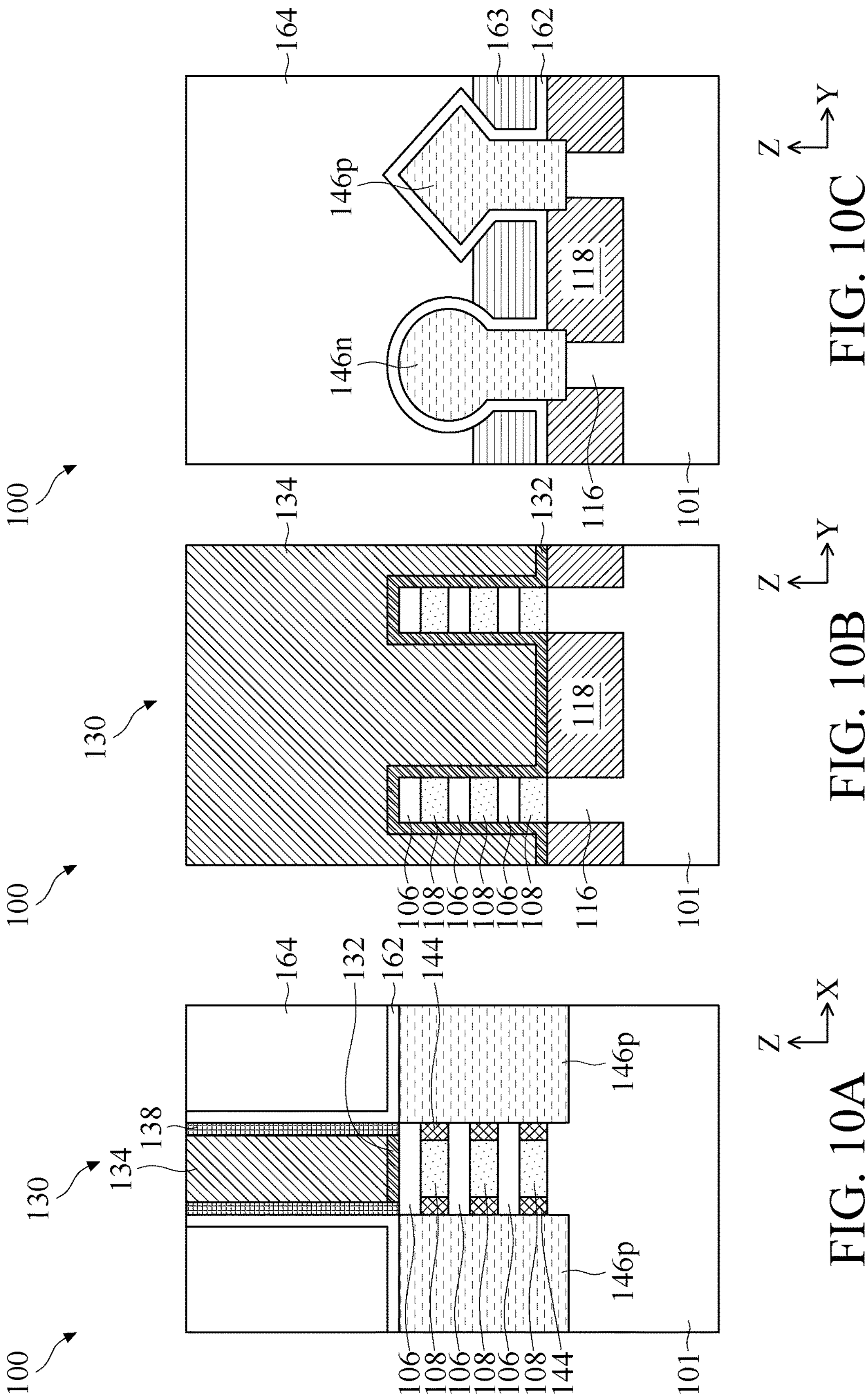
Figure 11B:
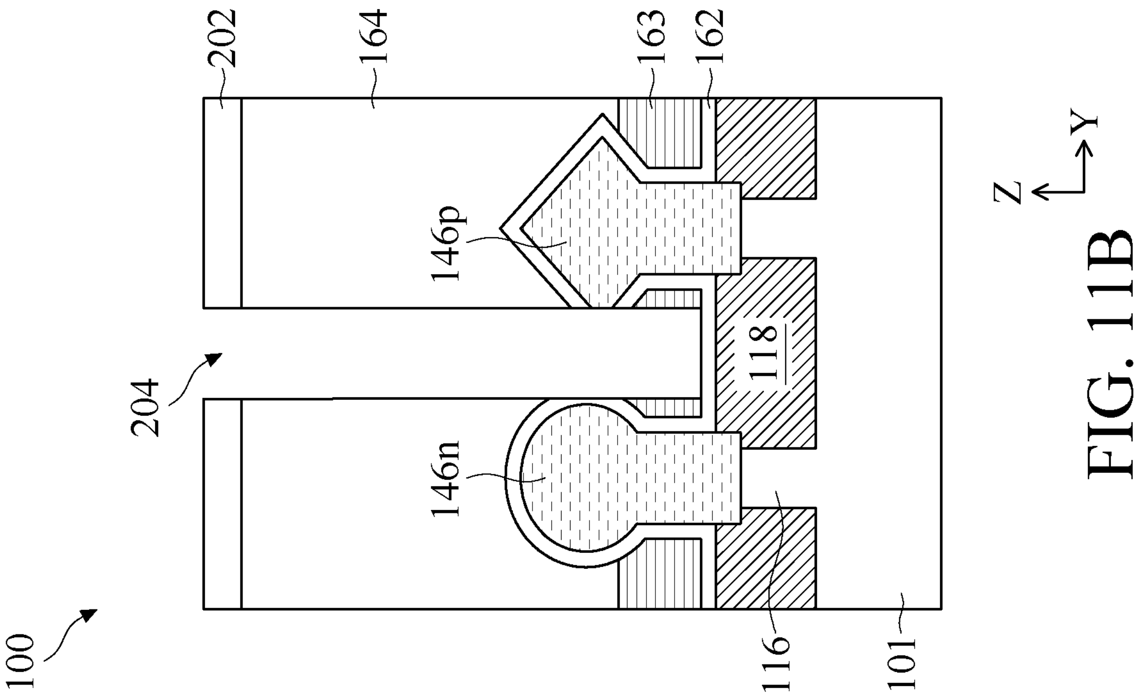
Figure 11A:
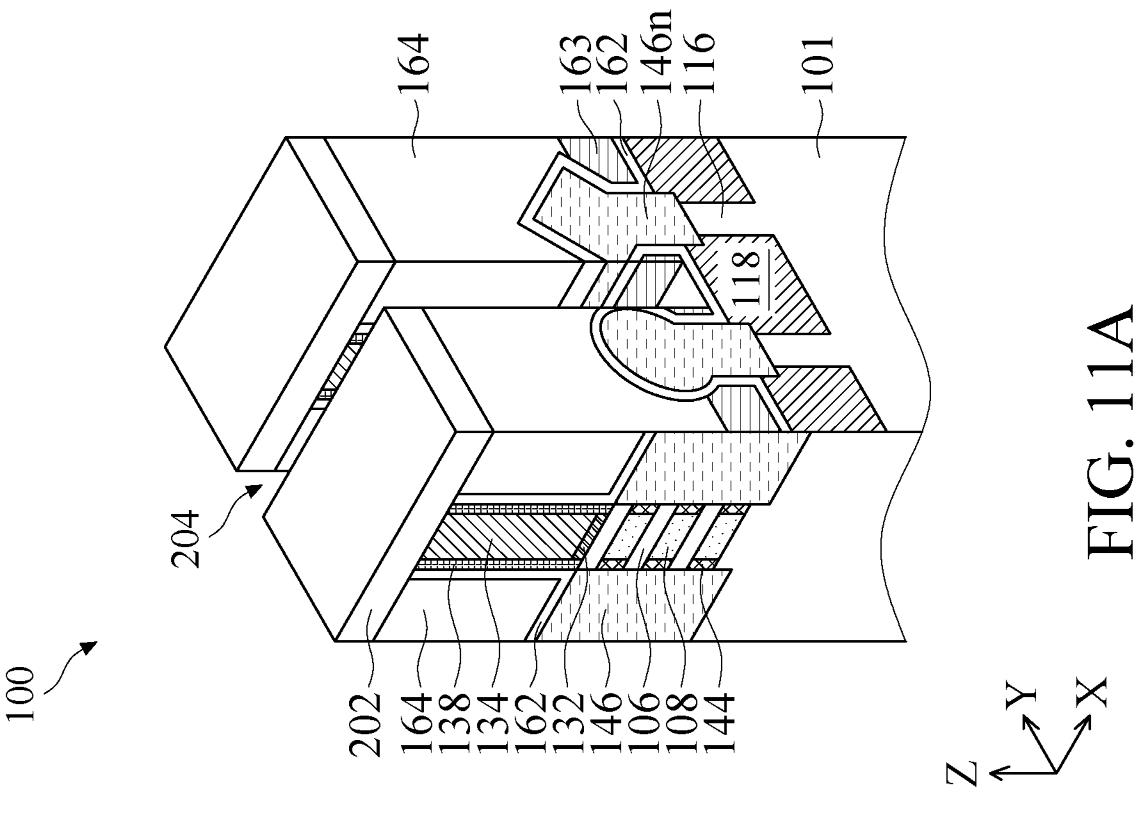

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, and the S/D regions 146*n*, 146*p*. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD. PECVD, ALD, or any suitable deposition technique. Next, a first interlayer dielectric (ILD) layer 163 is formed on the CESL 162 over the semiconductor device structure 100. The materials for the first ILD layer 163 may include compounds including Si, O, C, and/or H, such as silicon oxide, SiCOH, or SiOC. Organic materials, such as polymers, may also be used for the first ILD layer 163. The first ILD layer 163 may be deposited by a PECVD process or other suitable deposition technique. In some embodiments, after formation of the first ILD layer 163, the semiconductor device structure 100 may be subject to a thermal process to cure the first ILD layer 163. The curing temperature may range from about 550 degrees Celsius to about 700 degrees Celsius.

The first ILD layer 163 may be formed by first depositing a dielectric material to embed the S/D regions 146*n*. 146*p*, followed by an etch back process to expose portions of the S/D regions 146*n*, 146*p*. The first ILD layer 163 may have a thickness ranging from about 25 nm to about 75 nm, such as about 50 nm. In some embodiments, the top surface of the first ILD layer 163 is located at a level of the portion of the S/D regions 146*n*. 146*p* that has the largest dimension along the Y direction. In other words, the top surface of the first ILD layer 163 is located at a level where the S/D regions 146*n*. 146*p* are at the widest along the Y direction.

Next, a sacrificial dielectric layer 164 is deposited on the first ILD layer 163. The sacrificial dielectric layer 164 may include the same material and formed by the same process as the first ILD layer 163, except that the curing temperature is substantially less than the curing temperature of the first ILD layer 163. In some embodiments, the sacrificial dielectric layer 164 is cured at a temperature ranging from about 350 degrees Celsius to about 500 degrees Celsius. With the different curing temperatures, the first ILD layer 163 is substantially denser than the sacrificial dielectric layer 164. In an etch process, the etch rate of the sacrificial dielectric layer 164 may be substantially faster than that of the first ILD layer 163. The first ILD layer 163 may function as an etch stop layer in an etch process to remove the sacrificial dielectric layer 164.

After the sacrificial dielectric layer 164 is formed, a planarization operation, such as CMP, is performed on the semiconductor device structure 100 until the sacrificial gate electrode layer 134 is exposed, as shown in FIGS. 10A and 10B.

FIGS. 11A-12A are perspective views of various stages of manufacturing the semiconductor device structure 100, in accordance with some embodiments. FIGS. 11B-12B are cross-sectional side views of various stages of manufacturing the semiconductor device structure 100 taken along line C-C of FIG. 6, in accordance with some embodiments._As shown in FIGS. 11A and 11B, a hard mask 202 is formed on the sacrificial dielectric layer 164. The hard mask 202 may include a dielectric material, such as SiN, SiCN, SiOCN, SiOC, or other suitable dielectric material. The hard mask 202 may be used to form one or more openings 204 in the sacrificial dielectric layer 164, the first ILD layer 163, the CESL 162, and the isolation regions 120. The openings 204 may be formed between adjacent S/D regions 146*n*, adjacent S/D regions 146*p*, or adjacent S/D regions 146*n*, 146*p*. In the channel regions, the openings 204 are formed in the sacrificial gate electrode layer 134, the sacrificial gate dielectric layer 132, and the isolation regions 120. The openings 204 may be formed to separate the sacrificial gate electrode layer 134 into multiple portions. The process may be referred to as a cut poly gate (CPG) process. The openings 204 may be formed by one or more etch processes. In some embodiments, portions of the substrate 101 are exposed in the openings 204.

Figure 12A:
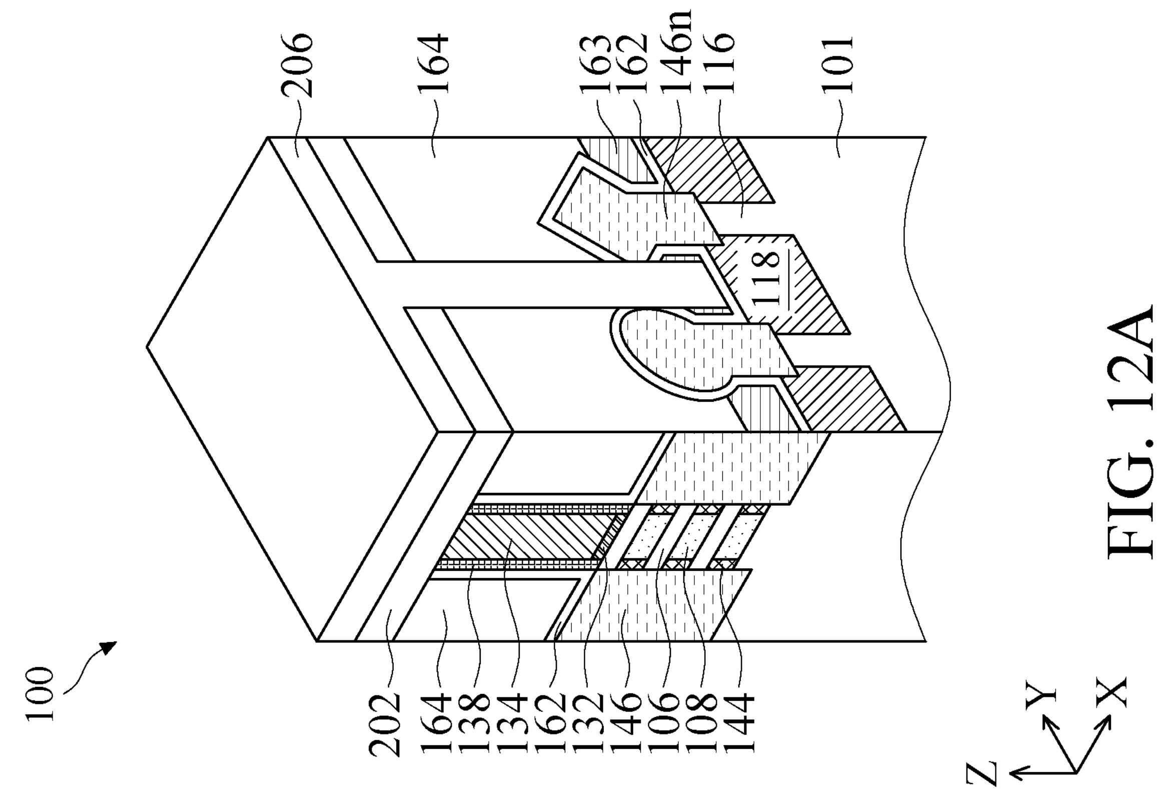
Figure 12B:
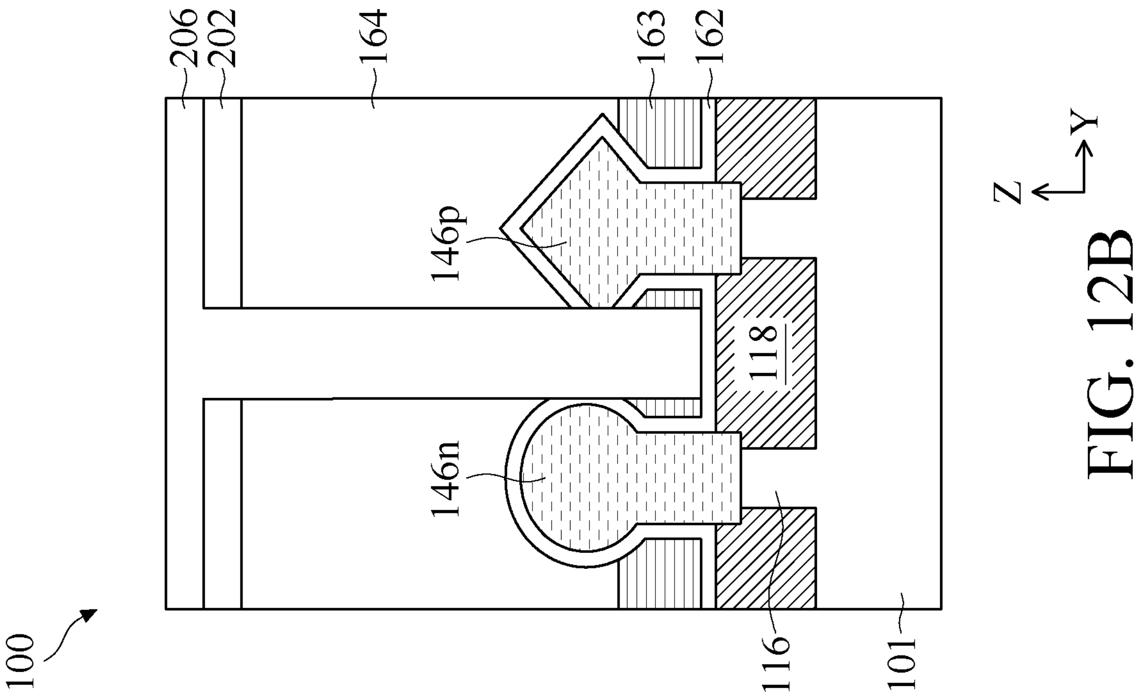
Figures 17A, 17B, 17C:
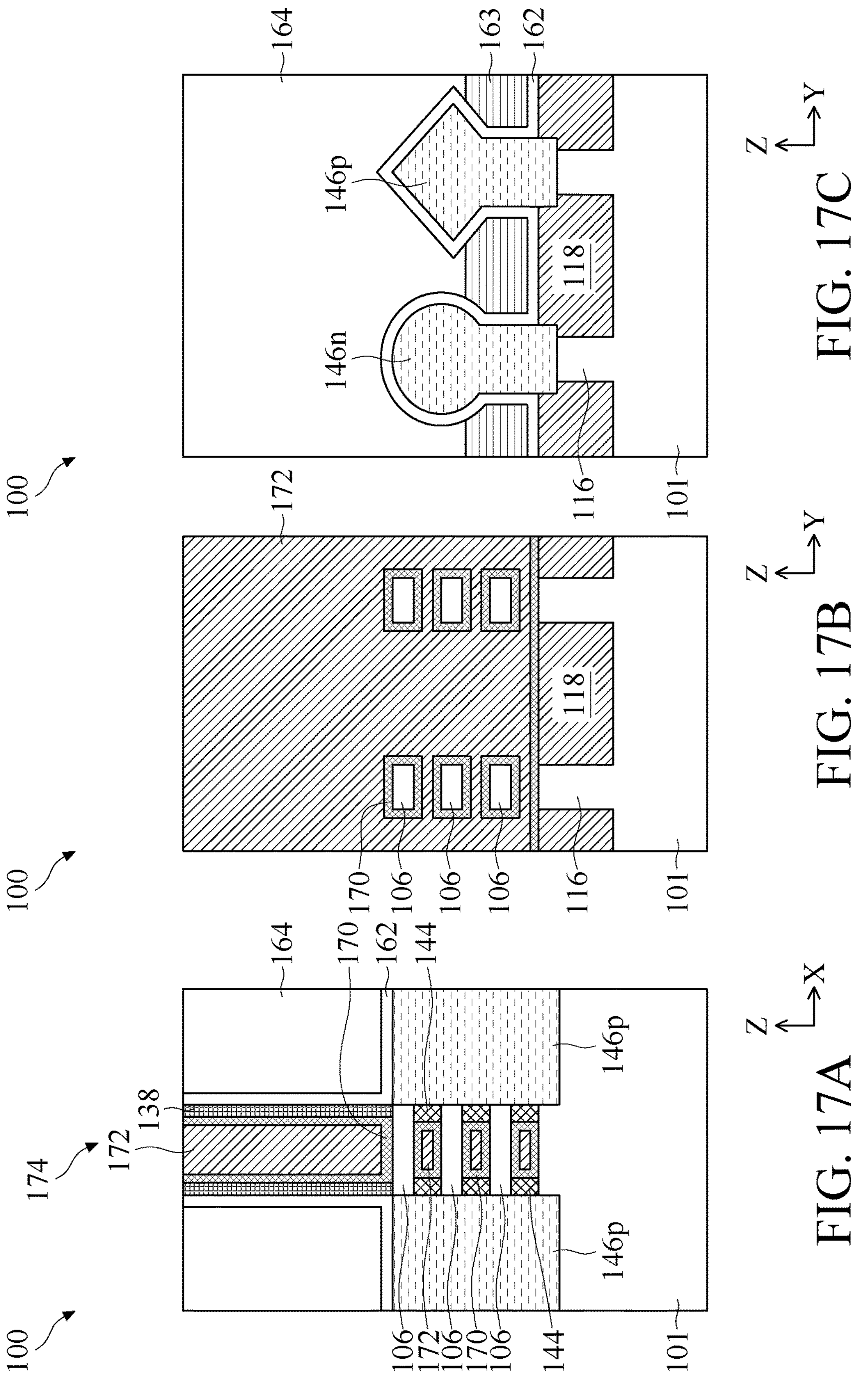

As shown in FIGS. 12A and 12B, a dielectric material 206 is formed in each opening 204. The dielectric material 206 may include any suitable dielectric material, such as SiN. In some embodiments, the dielectric material 206 includes the same material as the hard mask 202. The dielectric material 206 may be also formed on the hard mask 202. The dielectric material 206 electrically separates the portions of the sacrificial gate electrode layer 134. After the gate replacement process, which is described in FIGS. 17A and 17B, the dielectric material 206 electrically separates the gate electrode layers 172 (FIGS. 17A and 17B).

Figure 13:
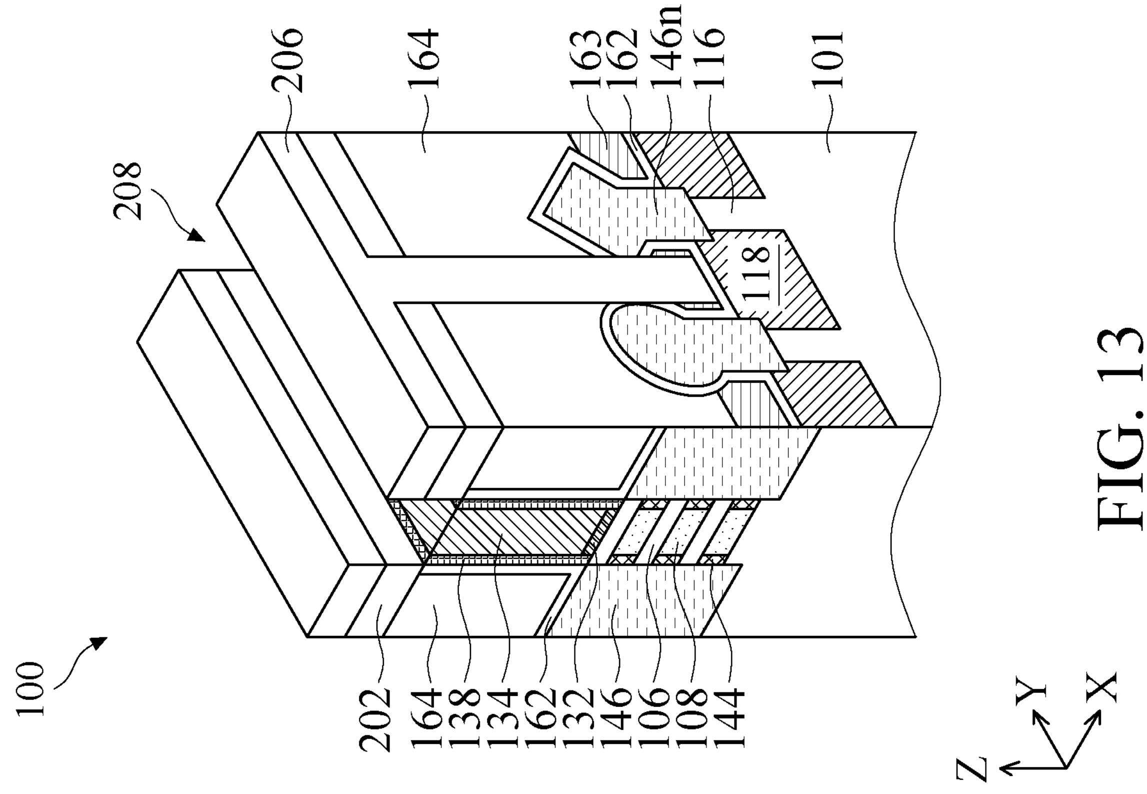
FIGS. 13-16 are perspective views of various stages of manufacturing the semiconductor device structure, in accordance with some embodiments.

FIGS. 13-16 are perspective views of various stages of manufacturing the semiconductor device structure 100, in accordance with some embodiments. As shown in FIG. 13, an opening 208 is formed in the hard mask 202 to expose a sacrificial gate electrode layer 134. In some embodiments, the gate spacers 138 and a portion of the dielectric material 206 are also exposed in the opening 208. A patterned photoresist (not shown), such as a trilayer photoresist, may be formed on the hard mask 202 to form the opening 208.

Figure 14:
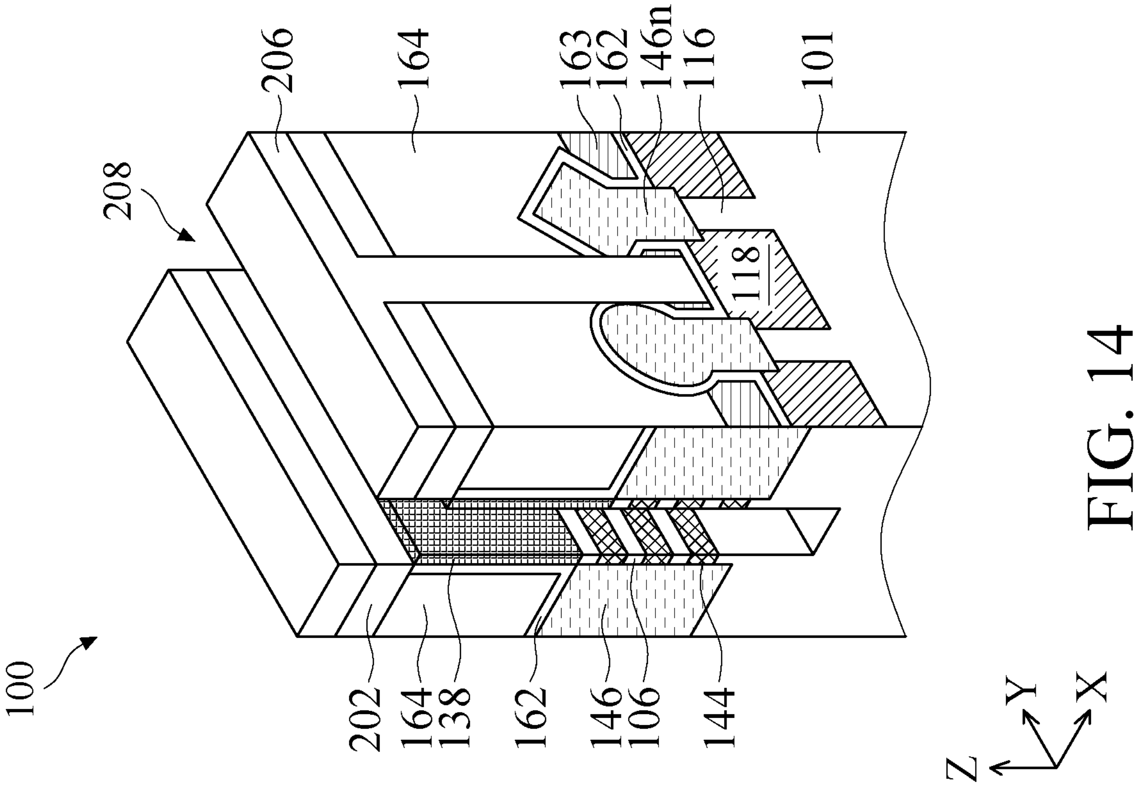

As shown in FIG. 14, the sacrificial gate electrode layer 134 exposed in the opening 208 is removed. Portions of the first semiconductor layers 106 and portions of the second semiconductor layers 108 disposed below the removed sacrificial gate electrode layer 134 are also removed. The removal of the sacrificial gate electrode layer 134, the portions of the first semiconductor layers 106, and the portions of the second semiconductor layers 108 may be performed by one or more etch processes. The one or more etch processes may be selective etch processes. As a result, the gate spacers 138, the hard mask 202, and the dielectric materials 206 are not substantially affected. Furthermore, the one or more etch processes may include at least one anisotropic etch process, and portions of the first semiconductor layers 106 located under the gate spacers 138 and between dielectric spacers 144 are not removed.

Figure 15:
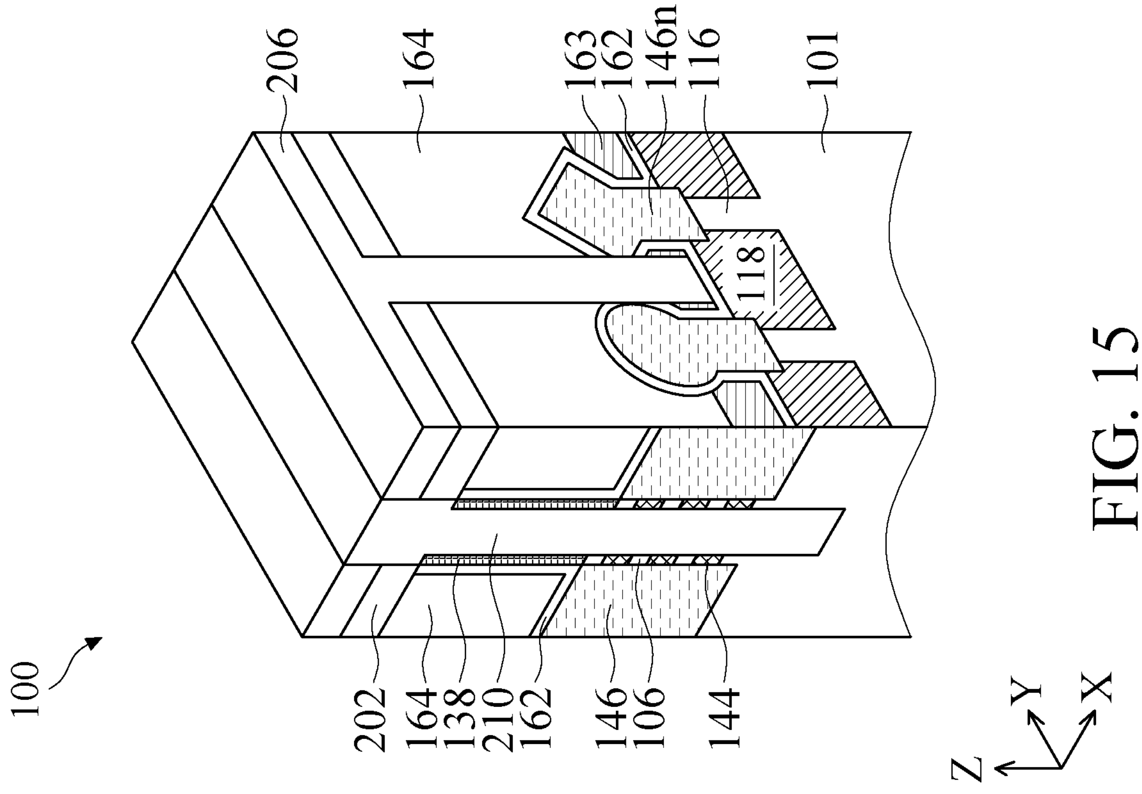

As shown in FIG. 15, a dielectric material 210 is formed in the opening 208. The dielectric material 210 may include any suitable dielectric material, such as SiN. In some embodiments, the dielectric material 210 includes the same material as the dielectric material 206. The processes for forming the dielectric materials 206 and the dielectric material 210 may be optional. In some embodiments, the etch rate of the sacrificial dielectric layer 164 may be substantially faster than that of the dielectric materials 206, 210.

Figure 16:
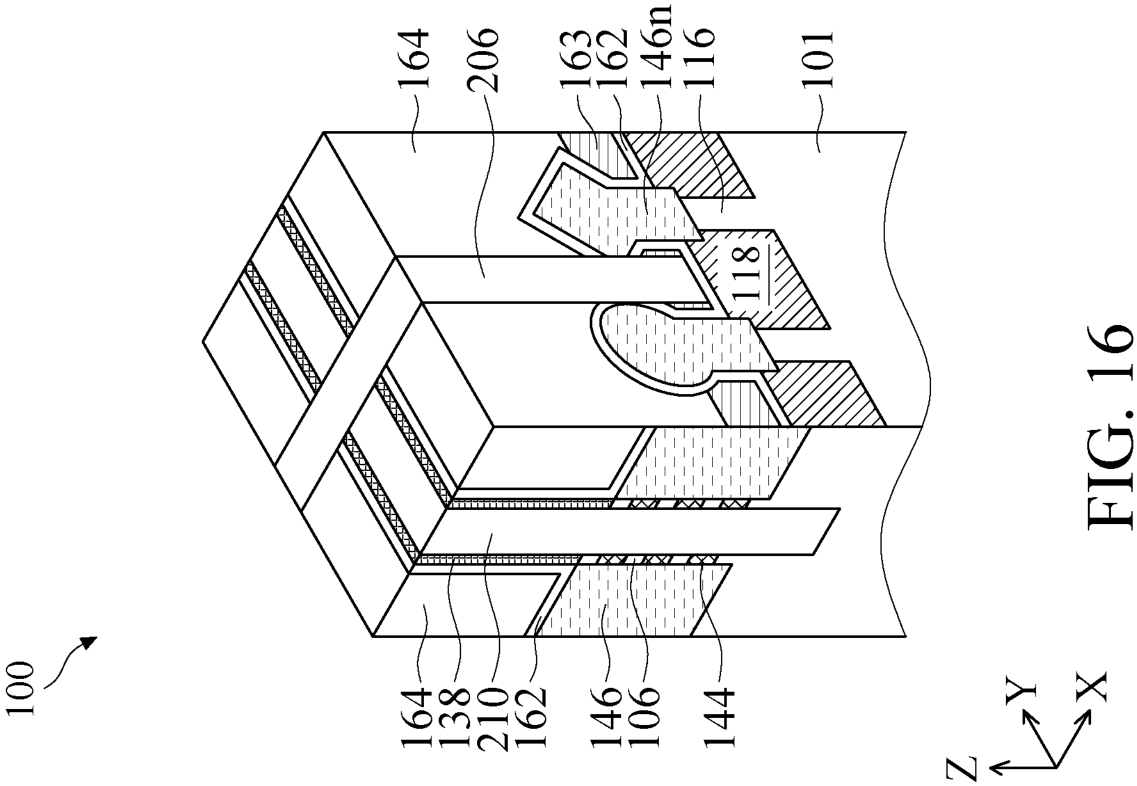

As shown in FIG. 16, the hard mask 202 is removed. The hard mask 202 may be removed by any suitable process. In some embodiments, a planarization process, such as a CMP process, is performed to remove the hard mask 202.

FIGS. 17A-19A are cross-sectional side views of various stages of manufacturing the semiconductor device structure 100 taken along line A-A of FIG. 6, in accordance with some embodiments. FIGS. 17B-19B are cross-sectional side views of various stages of manufacturing the semiconductor device structure 100 taken along line B-B of FIG. 6, in accordance with some embodiments. FIGS. 17C-19C are cross-sectional side views of various stages of manufacturing the semiconductor device structure 100 taken along line C-C of FIG. 6, in accordance with some embodiments. As shown in FIGS. 17A and 17B, the sacrificial gate structure 130 and the second semiconductor layers 108 are removed. The removal of the sacrificial gate structure 130 and the semiconductor layers 108 forms an opening between gate spacers 138 and between first semiconductor layers 106. The sacrificial dielectric layer 164 protects the S/D regions 146 during the removal processes. The dielectric materials 206, 210 are not substantially affected by the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric materials 206, 210, the sacrificial dielectric layer 164, and the CESL 162.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 138, the dielectric materials 206, 210, the sacrificial dielectric layer 164, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the sacrificial dielectric layer 164. The gate dielectric layer 170 and the gate electrode layer 172 formed over the sacrificial dielectric layer 164 are then removed by using, for example, CMP, until the top surface of the sacrificial dielectric layer 164 is exposed.

Figures 18A, 18B, 18C:
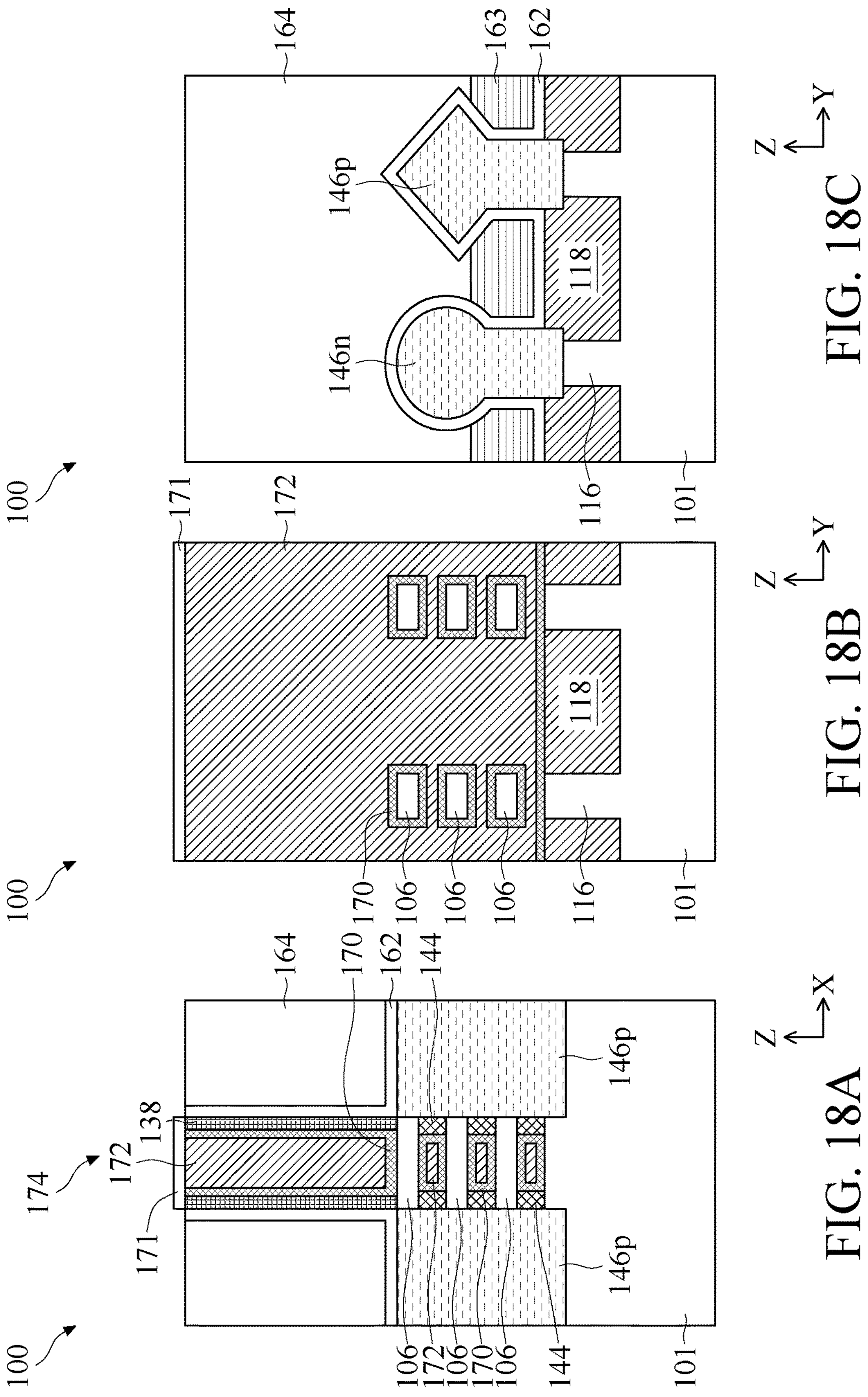

Next, as shown in FIGS. 18A to 18C, a cap layer 171 is selectively formed on the gate electrode layer 172 and the dielectric materials 206, 210. In some embodiments, the dielectric materials 206, 210 are made of a nitride, and the sacrificial dielectric layer 164 is made of an oxide. As a result, the cap layer 171 is selectively formed on the metal or the semiconductor material of the gate electrode layer 172 and the nitride material of the dielectric materials 206, 210, but not substantially formed on the oxide material of the sacrificial dielectric layer 164. In some embodiments, the gate dielectric layer 170 and the gate spacers 138 are also made of a nitride material, and the cap layer 171 is formed on the gate dielectric layer 170 and the gate spacers 138, as shown in FIG. 18A. In some embodiments, a small amount of the cap layer 171 is initially formed on the sacrificial dielectric layer 164, and the small amount of the cap layer 171 formed on the sacrificial dielectric layer 164 is subsequently removed by a clean process, such as a wet clean process using HF solution. For example, during the formation of the cap layer 171, a thicker cap layer 171 is formed on the gate electrode layer 172, the gate dielectric layer 170, the gate spacers 138, and the dielectric materials 206, 210, and a thinner cap layer 171 is formed on the sacrificial dielectric layer 164. Then, the clean process is performed to remove the cap layer 171 formed on the sacrificial dielectric layer 164. The thickness of the cap layer 171 formed on the gate electrode layer 172, the gate dielectric layer 170, the gate spacers 138, and the dielectric materials 206, 210 is reduced by the clean process. In some embodiments, the resulting cap layer 171 formed on the gate electrode layer 172, the gate dielectric layer 170, the gate spacers 138, and the dielectric materials 206, 210 ranges from about 2 nm to about 4 nm, such as about 3 nm. In some embodiments, the cap layer 171 is a metal layer, such as a titanium layer. The cap layer 171 may be formed by any suitable process, such as a CVD process utilizing $TiCl_4$ as a precursor. The $TiCl_4$ precursor may have a greater affinity to the metal and nitride surfaces than the oxide surface.

Figure 19A:
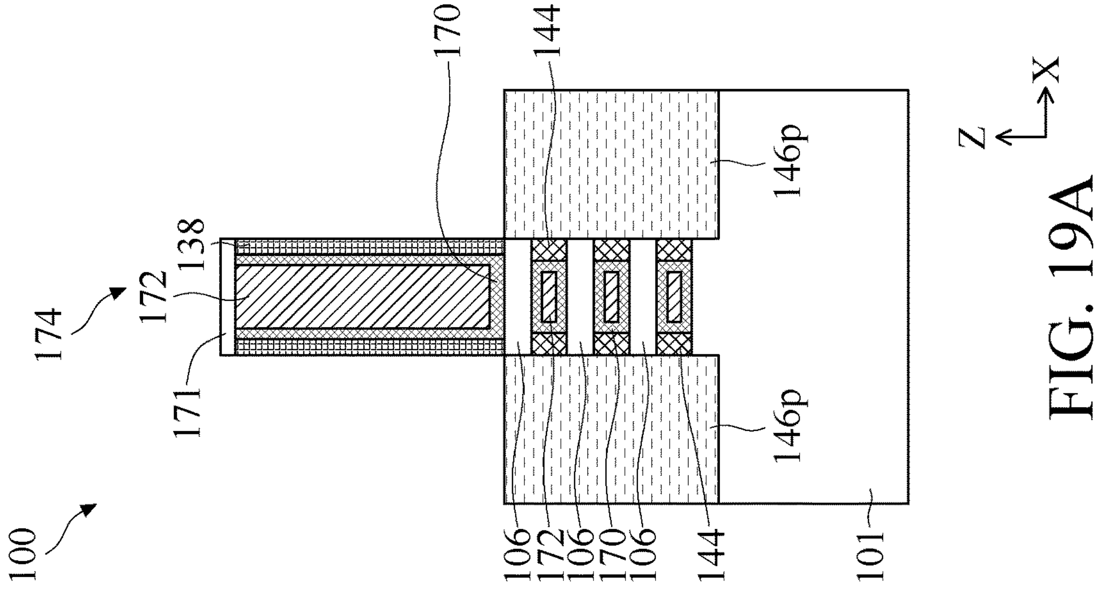
Figure 19B:
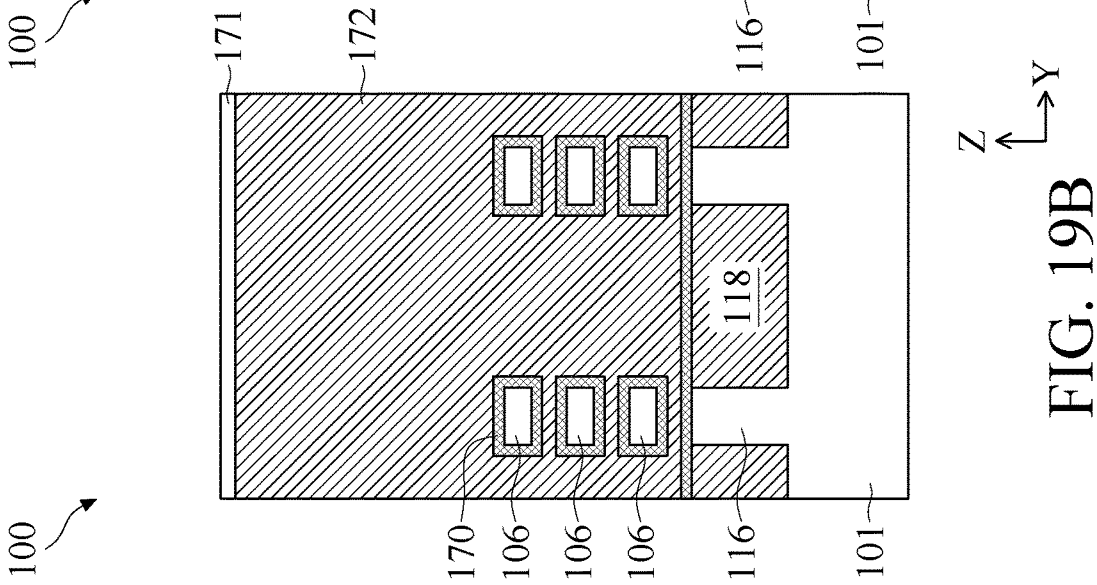
Figure 19C:
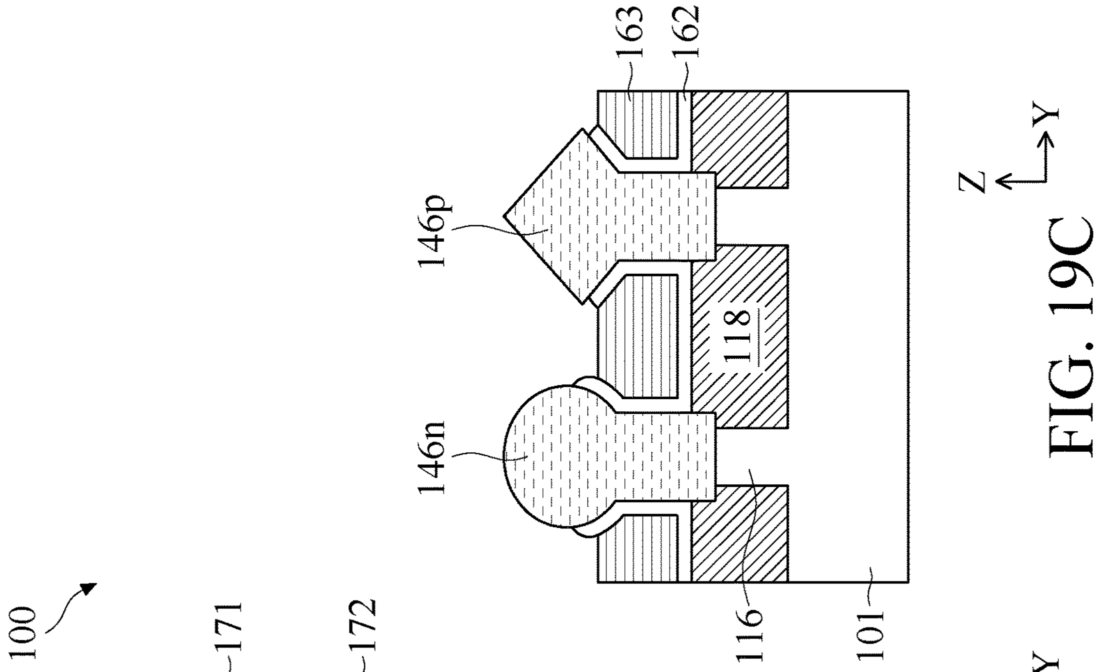

As shown in FIGS. 19A to 19C, the sacrificial dielectric layer 164 and portions of the CESL 162 are removed. The cap layer 171 functions as a mask layer to protect the gate electrode layer 172, the gate dielectric layer 170, the gate spacers 138, and the dielectric materials 206, 210. With the cap layer 171, a patterned mask layer is not used in the removal of the sacrificial dielectric layer and the portions of the CESL 162. As described above, the first ILD layer 163 is substantially denser than the sacrificial dielectric layer 164, and the etch rate of the sacrificial dielectric layer 164 may be substantially faster than that of the first ILD layer 163. As a result, the first ILD layer 163 may function as an etch stop layer during the removal the sacrificial dielectric layer 164. The sacrificial dielectric layer 164 and the portions of the CESL 162 may be removed by one or more etch processes, such as a dry etch, a wet etch, or a combination thereof. The one or more etch processes do not substantially affect the cap layer 171. As shown in FIG. 19C, the sacrificial dielectric layer 164 and portions of the CESL 162 are removed, and the top portions of the S/D regions 146*n*, 146*p* are exposed. As described above, in some embodiments, the etch rate of the sacrificial dielectric layer 164 may be substantially faster than that of the dielectric materials 206, 210. Thus, the cap layers 171 may or may not be used during the removal of the sacrificial dielectric layer 164 and the portions of the CESL 162. In other words, the sacrificial dielectric layer 164 and the cap layers 171 may be utilized alone or together to protect the dielectric materials 206, 210.

Figure 20B:
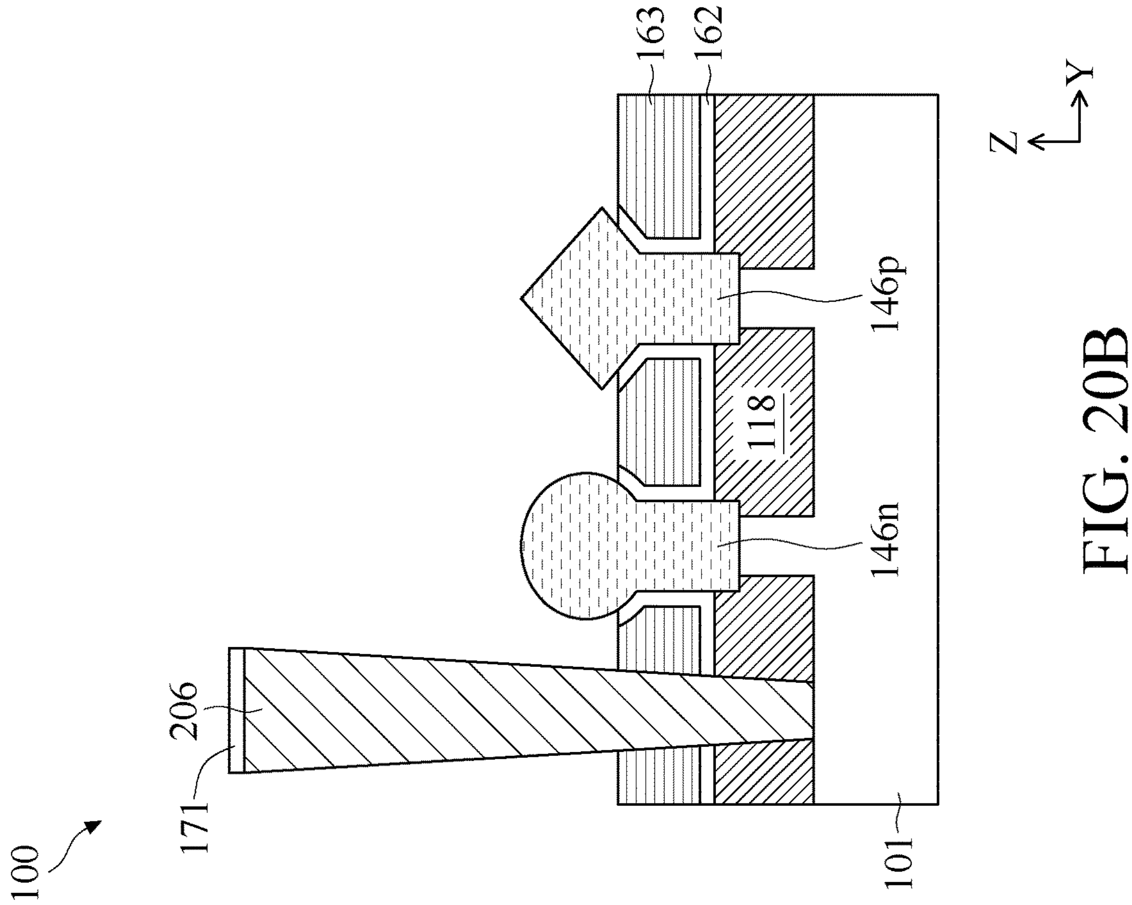
Figure 20A:
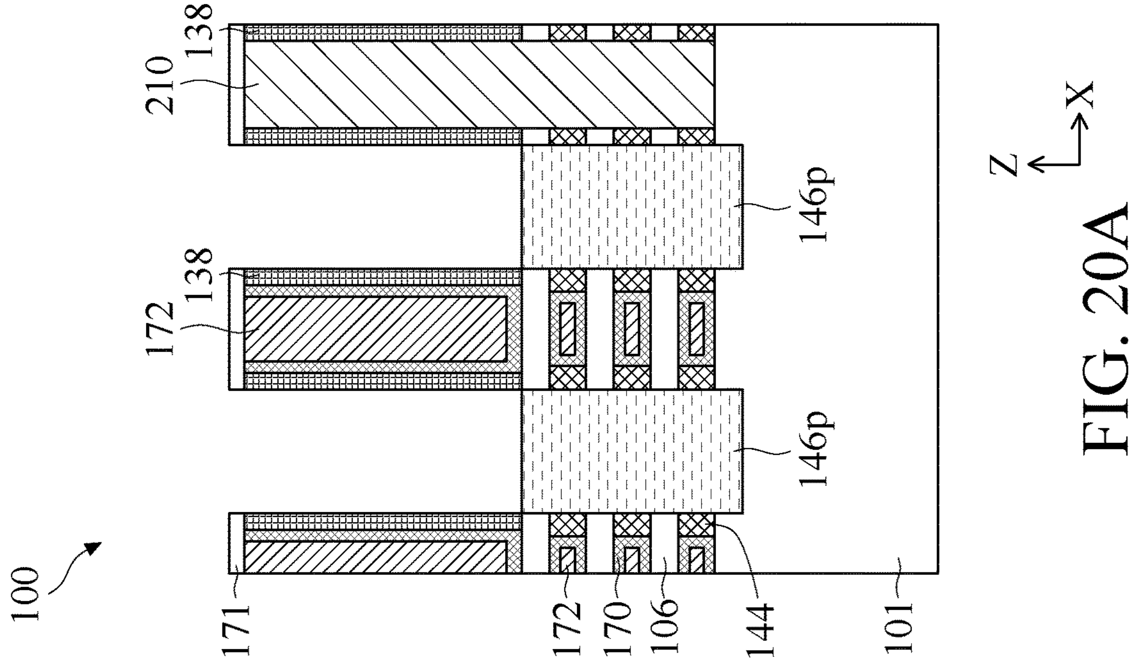

FIGS. 20A-23A are cross-sectional side views of various stages of manufacturing the semiconductor device structure 100 taken along line A-A of FIG. 6, in accordance with some embodiments. FIGS. 20B-23B are cross-sectional side views of various stages of manufacturing the semiconductor device structure 100 taken along line B-B of FIG. 6, in accordance with some embodiments. FIGS. 20A to 23A and 20B to 23B illustrate the semiconductor device structure 100 at the manufacturing stage shown in FIGS. 19A to 19C with the dielectric materials 206, 210 shown. As shown in FIGS. 20A and 20B, the cap layers 171 are selectively formed on the gate electrode layer 172, the gate spacers 138, and the dielectric materials 206, 210. The gate dielectric layers 170 are omitted in FIGS. 20A to 24A and 20B to 24B for clarity. As described in FIG. 10C, in some embodiments, the top surface of the first ILD layer 163 is located at a level of the portion of the S/D regions 146*n*, 146*p* that has the largest dimension along the Y direction. In some embodiments, a portion of the first ILD layer 163 may be removed during the removal of the sacrificial dielectric layer 164 and the portions of the CESL 162. As a result, the portions of the S/D regions 146*n*, 146*p* having the largest dimension along the Y direction may be exposed, as shown in FIG. 20B. The substrate 101 may also include the insulating material 118, which is not shown in FIGS. 20B, 21B, 22B, 23B, and 27B for clarity.

Figure 21A:
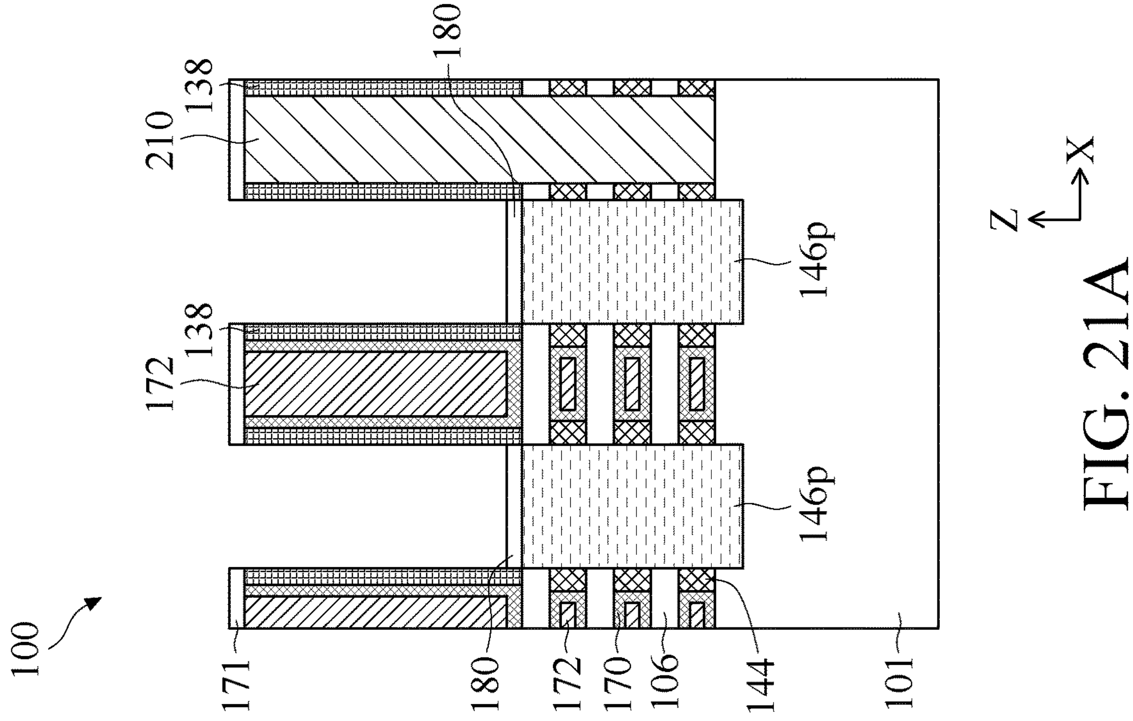
Figure 21B:
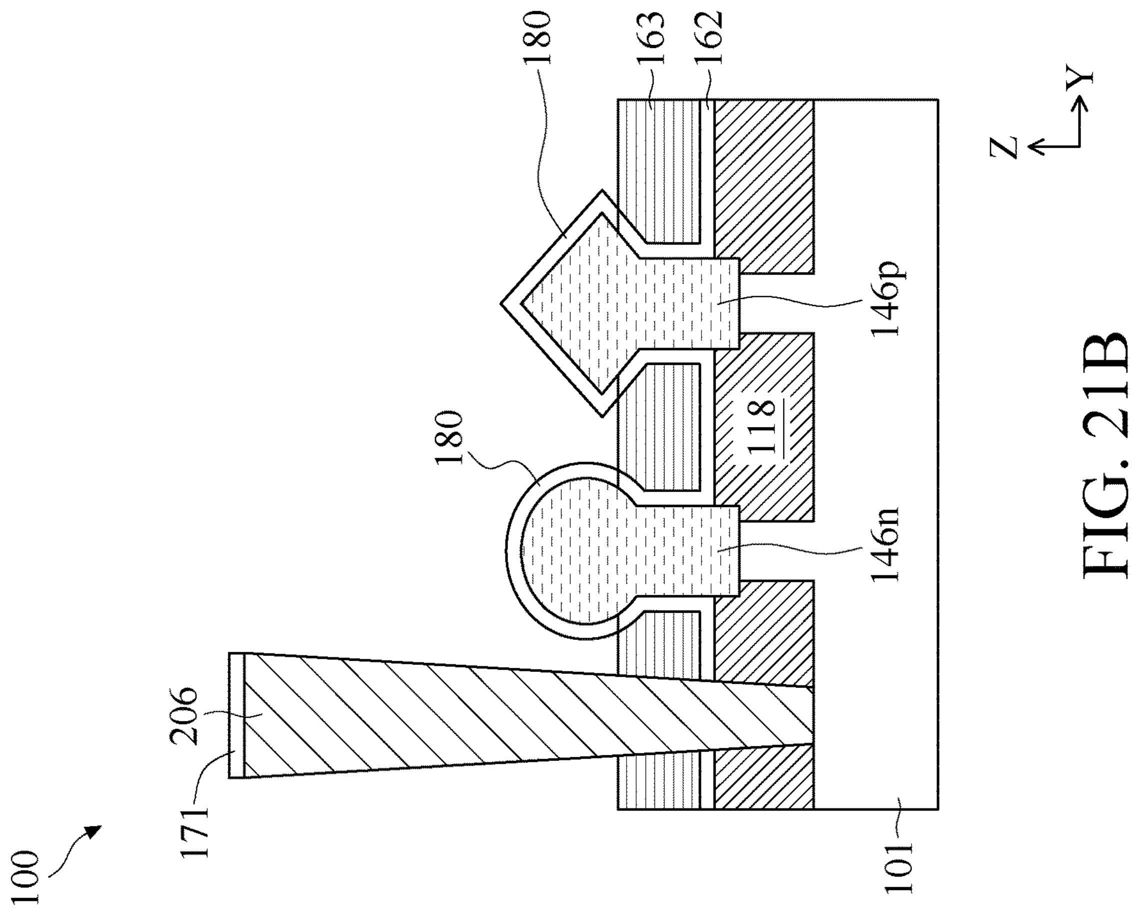

Next, as shown in FIGS. 21A and 21B, silicide layers 180 are formed on the S/D regions 146*n*, 146*p*. The silicide layers 180 may be formed by any suitable method. In some embodiments, a metal layer, such as a titanium layer, is first deposited on the cap layers 171, the gate spacers 138, the S/D regions 146*n*, 146*p*, and the first ILD layer 163. The portion of the metal layer in contact with the S/D regions 146*n*, 146*p* may react to form the silicide layers 180 during the deposition of the metal layer or during a thermal process subsequent to the deposition of the metal layer. Then, a selective etch process is performed to remove the metal layer formed on the cap layers 171, the gate spacers 138, and the first ILD layer 163. The selective etch process does not substantially affect the silicide layers 180, the gate spacers 138, and the first ILD layer 163. In some embodiments, a portion of the cap layers 171 may be removed during the selective etch process. In some embodiments, the silicide layers 180 may be formed by other suitable processes.

As described in FIG. 20B, the portions of the S/D regions 146*n*, 146*p* having the largest dimension along the Y direction are exposed. Thus, the silicide layers 180 are formed on the exposed portions of the S/D regions 146*n*, 146*p*. As shown in FIG. 21B, each silicide layer 180 covers the top portion of the S/D regions 146*n*, 146*p*. In some embodiments, the entire top surface of each S/D region 146*n*. 146*p* is covered with the silicide layer 180.

Figure 22B:
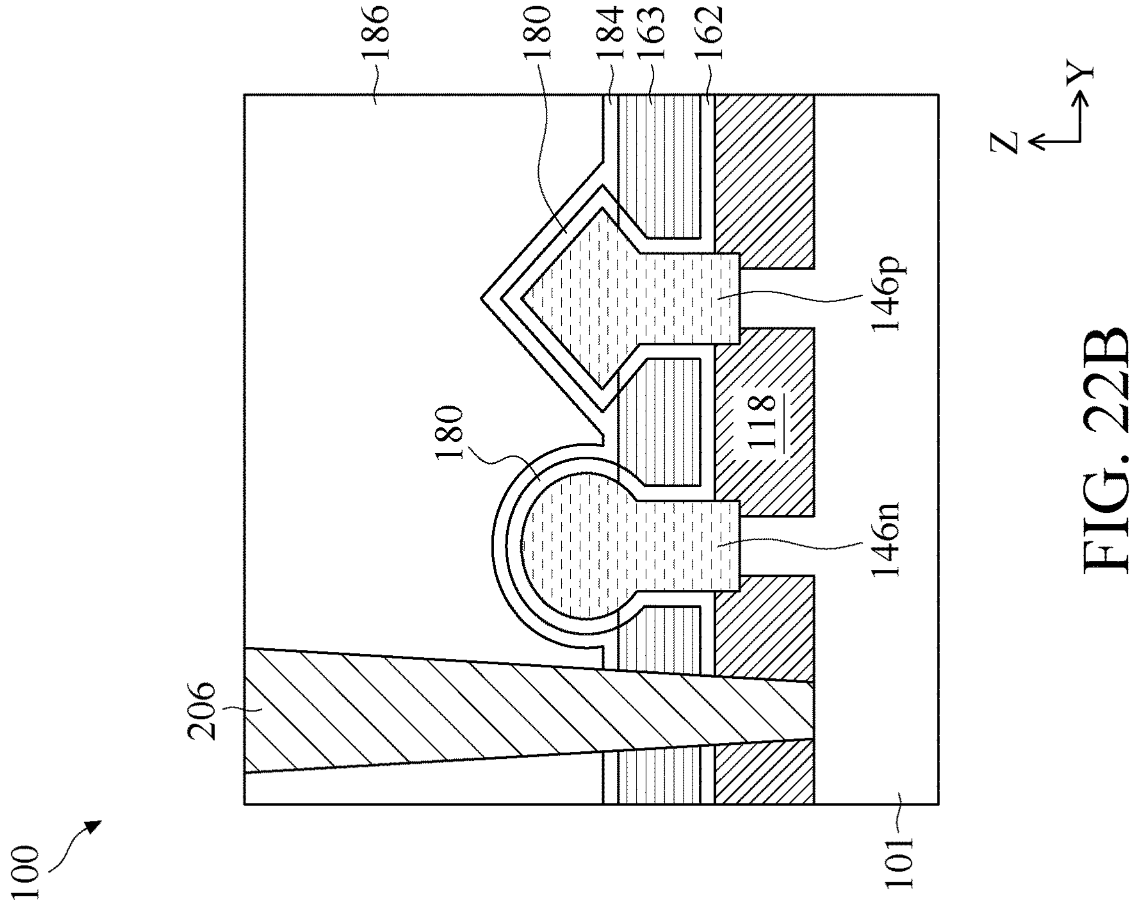
Figure 22A:
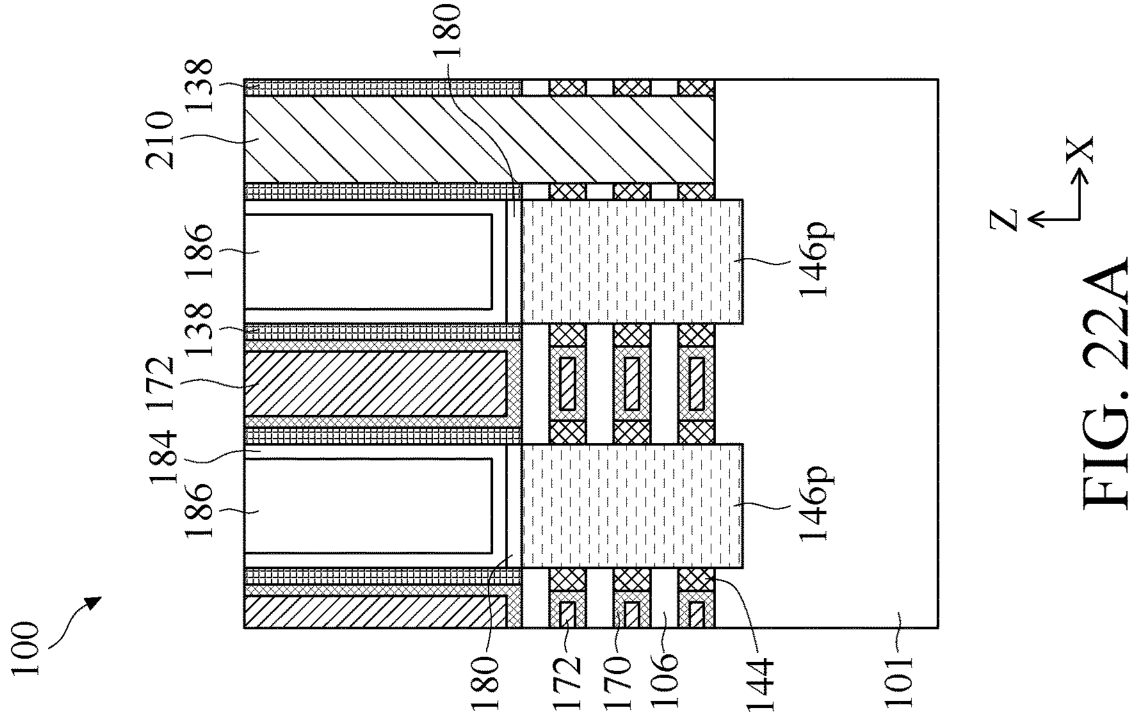

Next, as shown in FIGS. 22A and 22B, another CESL 184 and a second ILD layer 186 are formed on the silicide layers 180 and the first ILD layer 163. The CESL 184 may include the same material as the CESL 162, and the second ILD layer 186 may include the same material as the sacrificial dielectric layer 164. In some embodiments, the second ILD layer 186 is cured at a temperature ranging from about 350 degrees Celsius to about 500 degrees Celsius. If the curing temperature of the second ILD layer 186 is greater than about 500 degrees Celsius, the material of the gate electrode layers 172 may be negatively affected by the high temperature. As a result, in some embodiments, the semiconductor device structure 100 includes a first ILD layer 163, a CESL 184 disposed on the first ILD layer 163, and a second ILD layer 186 different from the first ILD layer 163 disposed on the CESL 184. The first and second ILD layers 163, 186 may include the same material but having different densities because the first and second ILD layers 163, 186 were cured at different temperatures. The first ILD layer 163 surrounds a bottom portion of the S/D regions 146*n*, 146*p*, and the second ILD layer 186 surrounds a top portion of the S/D regions 146*n*, 146*p*, as shown in FIG. 22B. In some embodiments, after forming the second ILD layer 186, a planarization process, such as a CMP process, is performed to expose the gate electrode layers 172 and the dielectric materials 206, 210. The cap layers 171 may be removed by the planarization process.

Figure 23B:
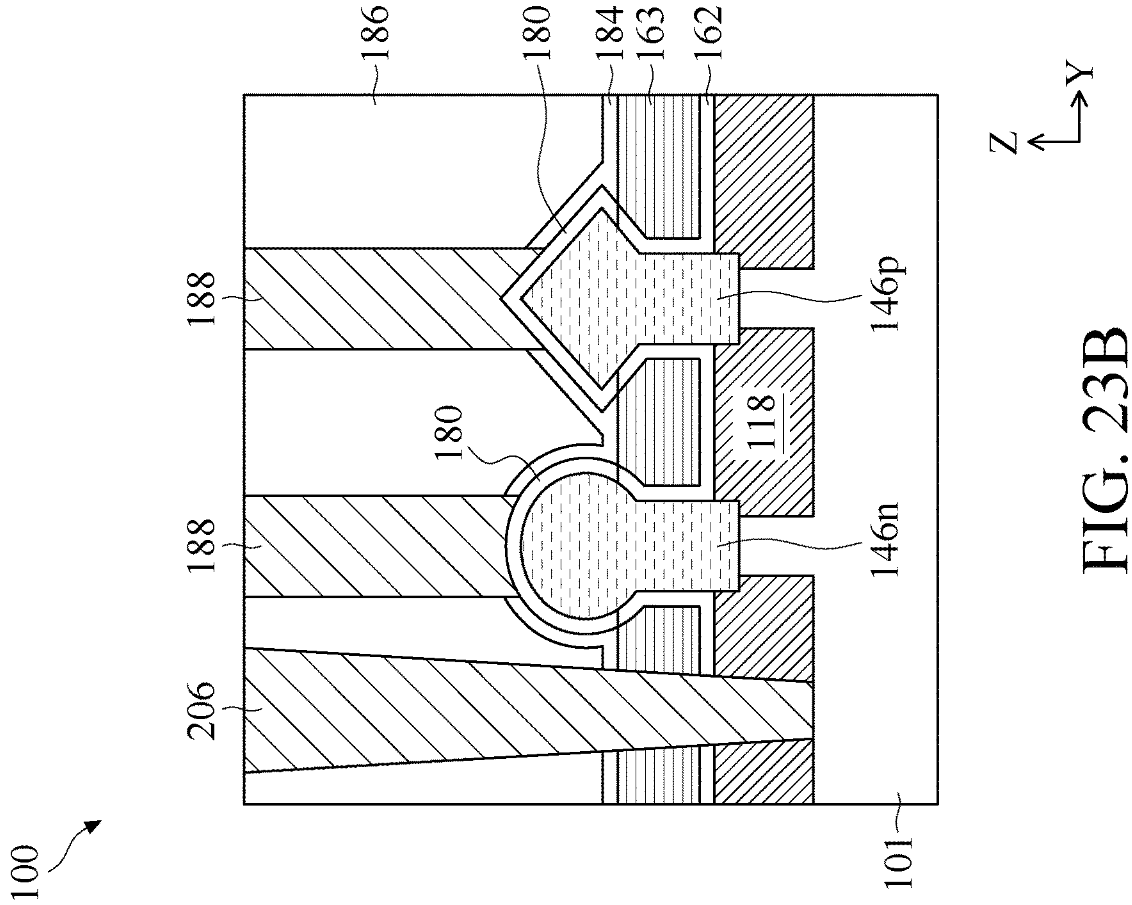
Figure 23A:
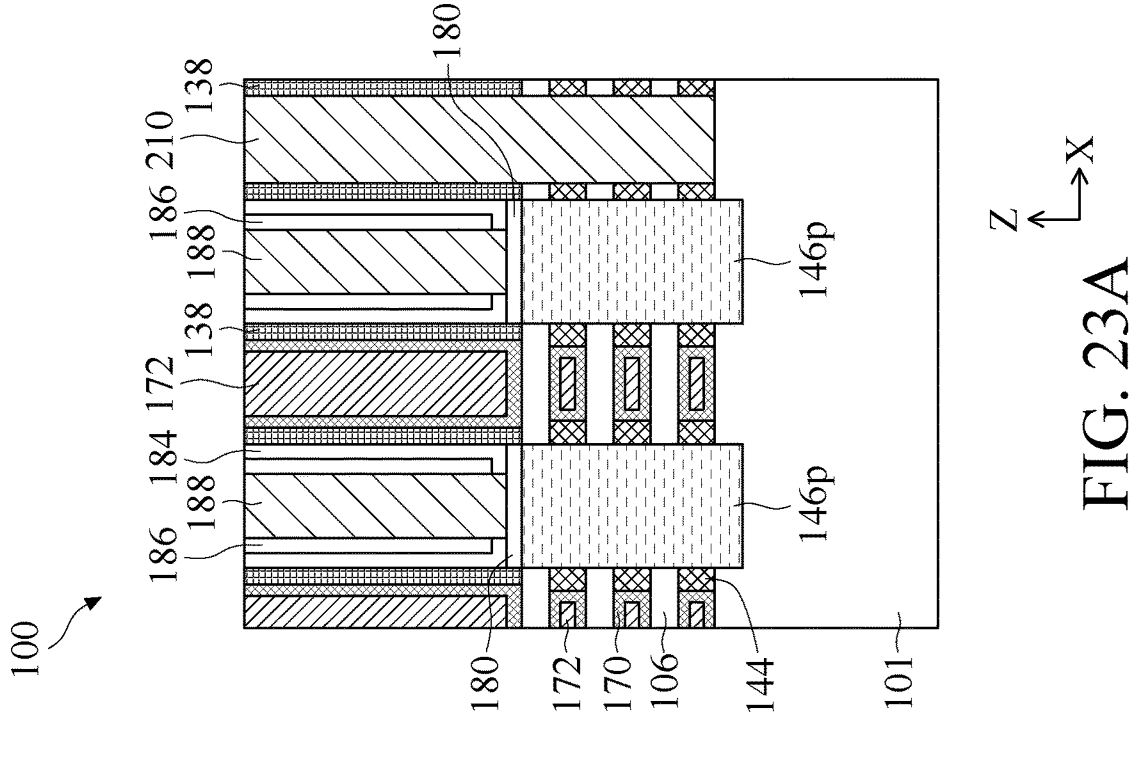

Next, as shown in FIGS. 23A and 23B, conductive contacts 188 are formed in the second ILD layer 186 and the CESL 184. The conductive contact 188 may include an electrically conductive material, such as TiN, W, Ru, Mo, Co, Cu, or other suitable electrically conductive material. In some embodiments, an optional barrier layer (not shown) is utilized to prevent diffusion of the conductive contact 188, if the conductive contact 188 includes a material that is susceptible to diffusion. A patterned mask (not shown) is used to form openings in the second ILD layer 186 and the CESL 184. The patterned mask protects the materials of the dielectric materials 206, 210 when forming the openings. The conductive contacts 188 are then deposited in the openings. A planarization process, such as a CMP process, may be performed to remove portions of the conductive contacts 188 formed on the dielectric materials 206, 210, the second ILD layer 186, and the gate electrode layers 172. As a result, in some embodiments, the top surfaces of the conductive contacts 188 are substantially coplanar with the top surfaces of the dielectric materials 206, 210 and the top surface of the second ILD layer 186, as shown in FIGS. 23A and 23B.

As described in FIGS. 20A to 23B, the silicide layers 180 are formed prior to forming the openings for the conductive contacts 216 and are formed on a larger portion of the S/D regions 146*n*, 146*p* compared to the conductive contacts 216. In other words, each silicide layer 180 has a dimension extending along the Y direction substantially greater than a dimension of a corresponding conductive contact 188 extending along the Y direction. The larger silicide layers 180 may lead to reduced S/D contact resistance (Rcsd). Furthermore, by using sacrificial dielectric layer 164 and/or the cap layers 171, the dielectric materials 206, 210 are not substantially affected. In addition, the cap layers 171 also protect the gate spacers 138.

FIGS. 24A to 27B illustrate a process to form the silicide layers 180 in accordance with alternative embodiments. FIGS. 24A-25A are cross-sectional side views of various stages of manufacturing the semiconductor device structure taken along line A-A of FIG. 6, in accordance with alternative embodiments. FIGS. 24B-25B are cross-sectional side views of various stages of manufacturing the semiconductor device structure taken along line B-B of FIG. 6, in accordance with alternative embodiments. FIGS. 24C-25C are cross-sectional side views of various stages of manufacturing the semiconductor device structure taken along line C-C of FIG. 6, in accordance with alternative embodiments.

Figures 24A, 24B, 24C:
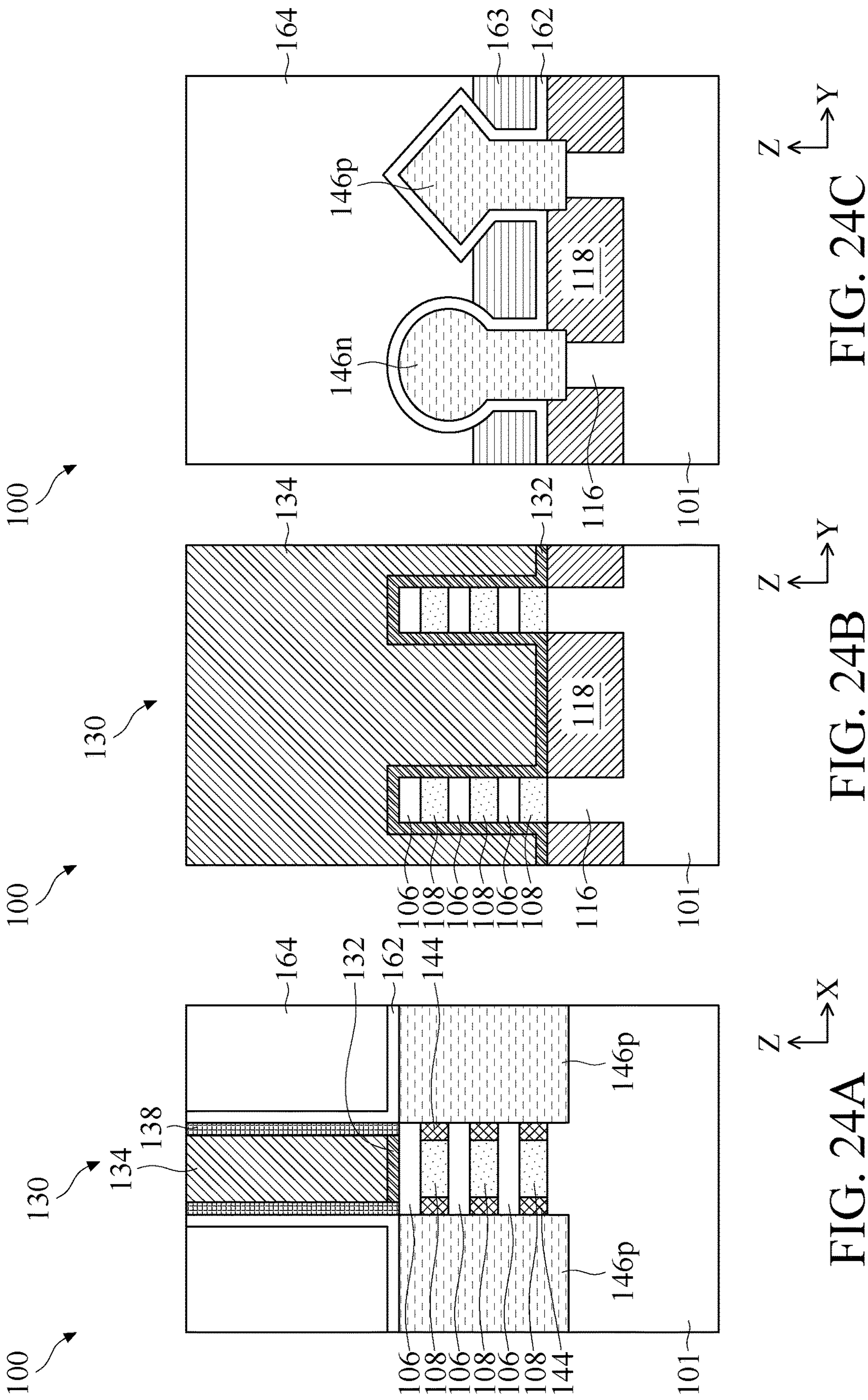
Figures 25A, 25B, 25C:
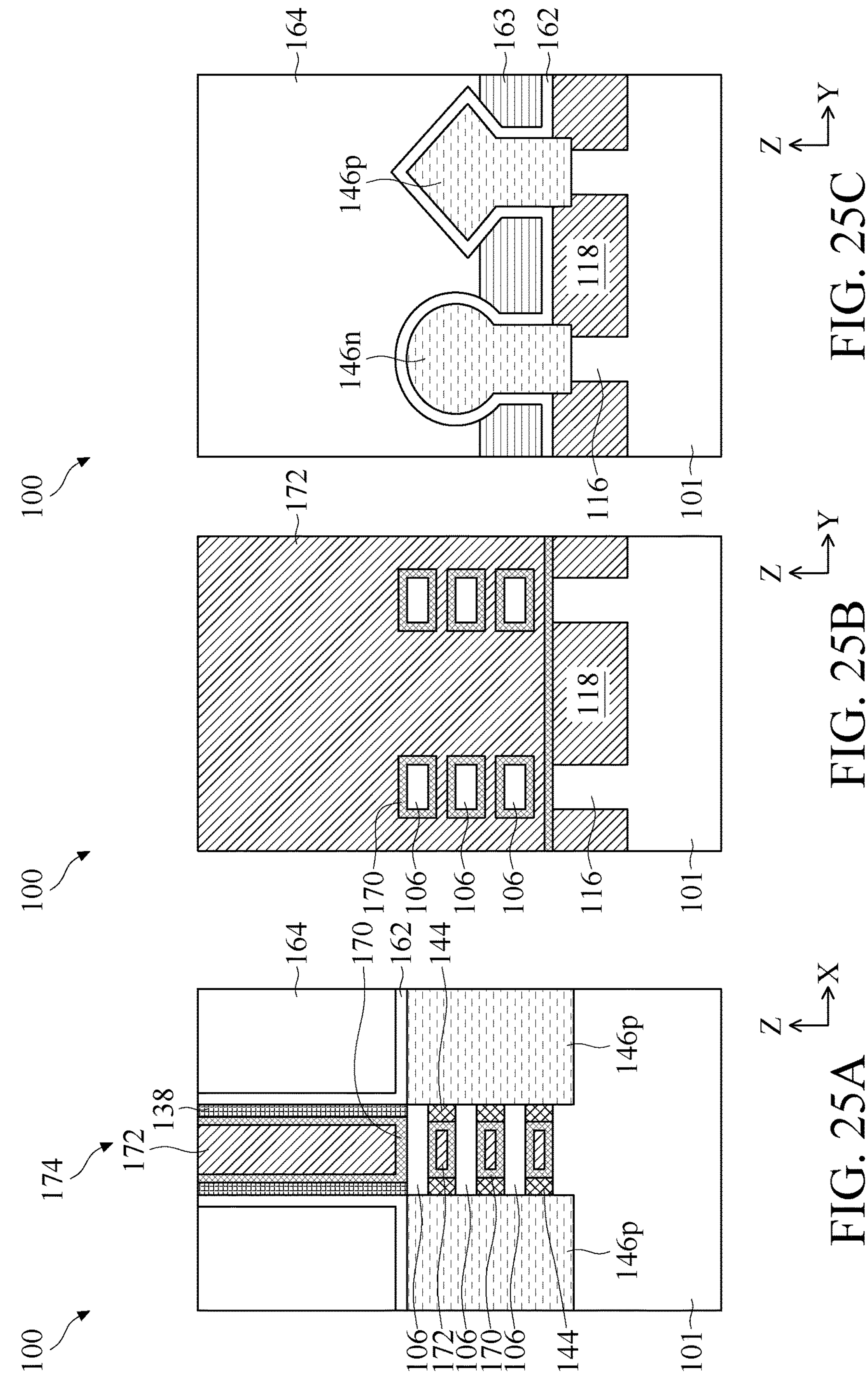

FIGS. 24A to 24C illustrate the semiconductor device structure 100 after the formation of the sacrificial dielectric layer 164, which is the same manufacturing stage as the semiconductor device structure 100 shown in FIGS. 10A to 10C. Next, instead of performing the processes to form the dielectric materials 206, 210, the replacement gate process is performed. As shown in FIGS. 25A to 25C, the sacrificial gate structure 130 and the second semiconductor layers 108 are removed, and the gate structure 174 is formed.

Figure 26:
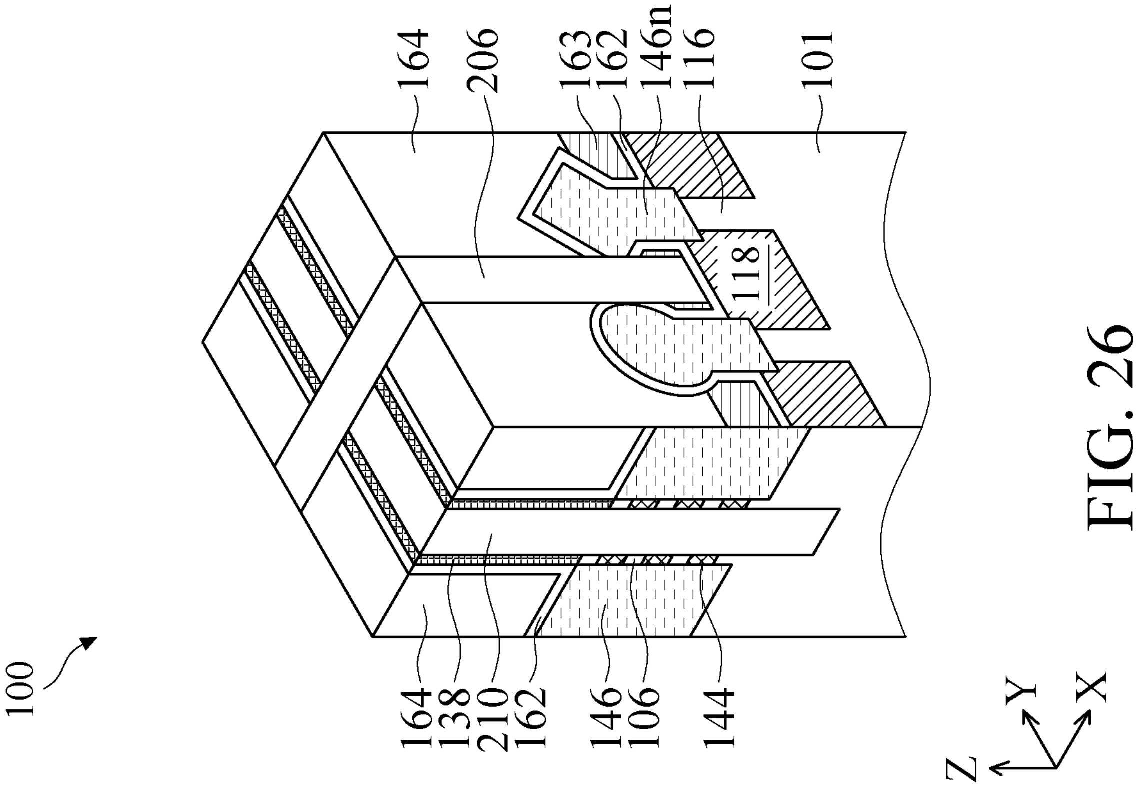
FIG. 26 is a perspective view of one of various stages of manufacturing the semiconductor device structure, in accordance with alternative embodiments.

Next, as shown in FIG. 26, the dielectric materials 206, 210 are formed. The dielectric materials 206, 210 may be formed by the same processes described in FIGS. 11A to 15. The CPG process described in FIG. 11B may be a cut metal gate (CMG) process. The gate electrode layer 172 is cut and separated by the dielectric material 206 instead of cutting the sacrificial gate electrode layer 134. Furthermore, instead of removing a sacrificial gate electrode layer 134 and the portions of the first semiconductor layers 106 and the second semiconductor layers 108 disposed below the sacrificial gate electrode layer 134, the gate structure 174 and the portions of the first semiconductor layers 106 surrounded by the gate structure 174 are removed. The dielectric material 210 replaces the removed gate structure 174 and the portions of the first semiconductor layers 106.

Figure 27B:
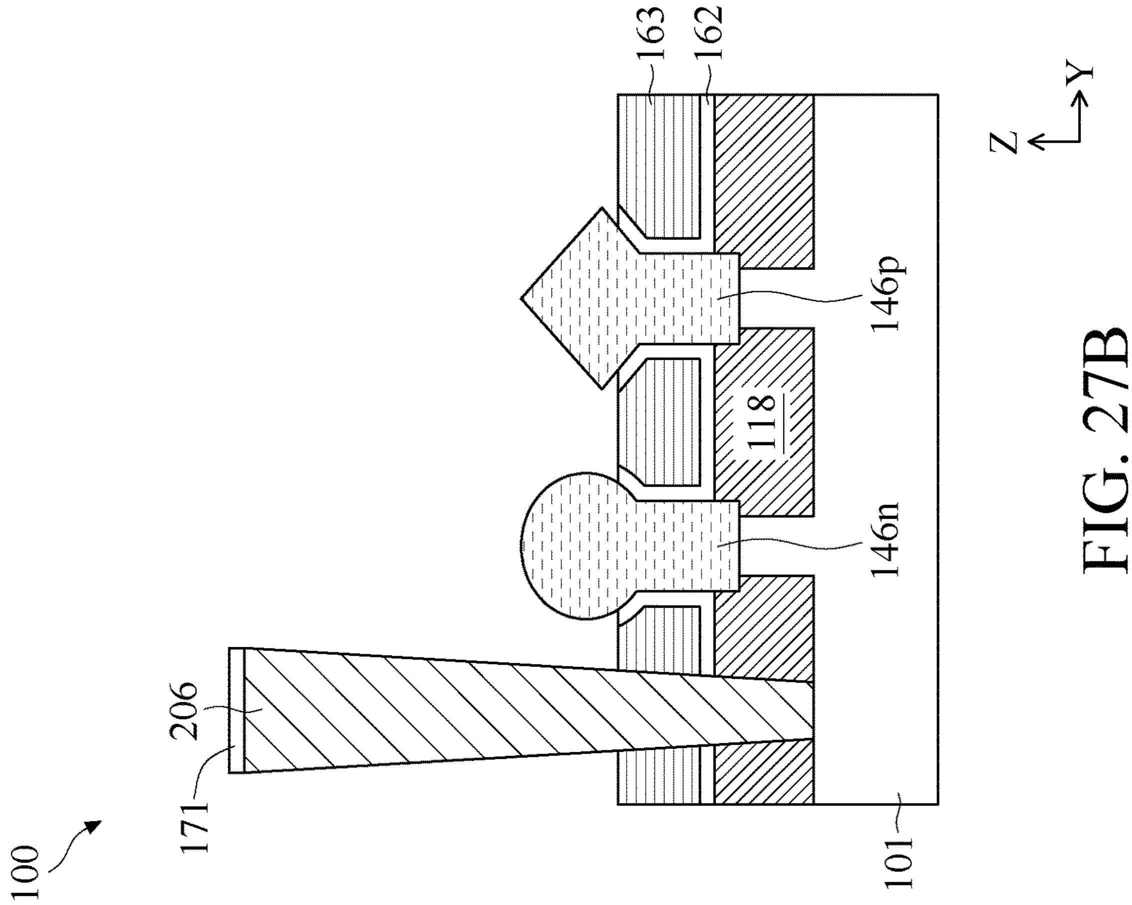
FIGS. 27A-27B are cross-sectional side views of one of various stages of manufacturing the semiconductor device structure, in accordance with alternative embodiments.
Figure 27A:
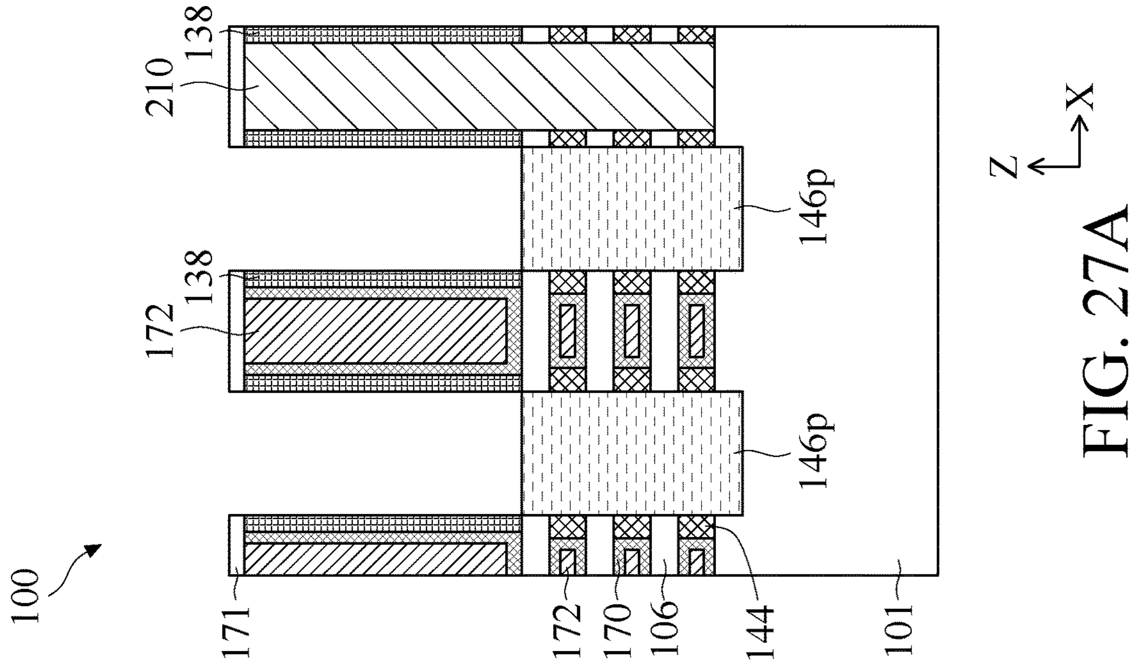

After the replacement gate process to form the gate structure 174, the processes described in FIGS. 18A to 23B are performed. In some embodiments, the cap layers 171 are selectively deposited on the gate electrode layers 172, the gate spacers 138, and the dielectric materials 206, 210. The sacrificial dielectric layer 164 and the portions of the CESL 162 are then removed to expose the top portions of the S/D regions 146*n*, 146*p*, as shown in FIGS. 27A and 27B. The silicide layers 180, the CESL 184, the second ILD layer 186, and the conductive contacts 188 are then formed. The processes to form the silicide layers 180, the CESL 184, the second ILD layer 186, and the conductive contacts 188 may be the same processes described in FIGS. 20A to 23B.

Embodiments of the present disclosure provide a semiconductor device structure 100 including a silicide layer 180 having a dimension along the Y direction substantially greater that a dimension along the Y direction of the conductive contact 188. Furthermore, the semiconductor may include the first and second ILD layers 163, 186 surrounding the S/D regions 146*n*, 146*p*. Some embodiments may achieve advantages. For example, the larger silicide layers 180 may lead to reduced S/D contact resistance.

An embodiment is a semiconductor device structure. The structure includes a source/drain region disposed over a substrate, a first interlayer dielectric layer surrounding a first portion of the source/drain region, a second interlayer dielectric layer distinct from the first interlayer dielectric layer surrounding a second portion of the source/drain region, a silicide layer disposed on the source/drain region, and a conductive contact disposed over the source/drain region. The conductive contact is disposed in the second interlayer dielectric layer.

Another embodiment is a semiconductor device structure. The structure includes a source/drain region disposed over a substrate, a first contact etch stop layer in contact with a bottom portion of the source/drain region, a first interlayer dielectric layer in contact with the first contact etch stop layer, a silicide layer in contact with a top portion of the source/drain region, a second contact etch stop layer distinct from the first contact etch stop layer in contact with the first contact etch stop layer, the silicide layer, and the first interlayer dielectric layer, and a second interlayer dielectric layer in contact with the second contact etch stop layer.

A further embodiment is a method for forming a semiconductor device structure. The method includes depositing a first interlayer dielectric layer to embed a source/drain region, curing the first interlayer dielectric layer at a first temperature, removing a portion of the first interlayer dielectric layer to expose a portion of the source/drain region, depositing a sacrificial dielectric layer on the first interlayer dielectric layer, curing the sacrificial dielectric layer at a second temperature substantially less than the first temperature, and removing the sacrificial dielectric layer to expose the portion of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

depositing a first contact etch stop layer on a source/drain region, depositing a first interlayer dielectric layer to embed a source/drain region, wherein the first interlayer dielectric layer is deposited on the first contact etch stop layer;

curing the first interlayer dielectric layer at a first temperature;

removing a portion of the first interlayer dielectric layer;

depositing a sacrificial dielectric layer on the first interlayer dielectric layer;

curing the sacrificial dielectric layer at a second temperature substantially less than the first temperature;

removing the sacrificial dielectric layer; and removing a portion of the first contact etch stop layer after removing the sacrificial dielectric layer, wherein a portion of the source/drain region is exposed.

2. The method of claim 1, further comprising forming a silicide layer on the exposed portion of the source/drain region.

3. The method of claim 2, further comprising depositing a second contact etch stop layer on the silicide layer, the first interlayer dielectric layer, and the first contact etch stop layer.

4. The method of claim 3, further comprising depositing a second interlayer dielectric layer on the second contact etch stop layer.

5. The method of claim 1, wherein the first temperature ranges from about 550 degrees Celsius to about 700 degrees Celsius.

6. The method of claim 5, wherein the second temperature ranges from about 350 degrees Celsius to about 500 degrees Celsius.

7. A method for forming a semiconductor device structure, comprising:

depositing a first contact etch stop layer (CESL) over a source/drain region;

depositing a first interlayer dielectric layer over the first CESL;

removing a portion of the first interlayer dielectric layer and a portion of the first CESL to expose a portion of the source/drain region;

forming a silicide layer on the portion of the source/drain region;

depositing a second CESL on the silicide layer and over the first CESL, wherein the first CESL is adjacent the source/drain region; and depositing a second interlayer dielectric layer on the second CESL.

8. The method of claim 7, further comprising forming a conductive contact through the second interlayer dielectric layer and the second CESL.

9. The method of claim 8, wherein the silicide layer has a dimension greater than a dimension of the conductive contact.

10. The method of claim 7, wherein top surfaces of the first CESL and the first interlayer dielectric layer are coplanar.

11. The method of claim 10, wherein the silicide layer is formed on the first CESL.

12. The method of claim 11, wherein the second CESL is deposited on the first interlayer dielectric layer.

13. The method of claim 7, further comprising depositing a sacrificial dielectric layer on the first CESL.

14. The method of claim 13, wherein the first interlayer dielectric layer is denser than the sacrificial dielectric layer.

15. A method for forming a semiconductor device structure, comprising:

depositing a first contact etch stop layer (CESL) over a source/drain region;

depositing a first interlayer dielectric layer on the first CESL;

recessing the first interlayer dielectric layer;

depositing a sacrificial dielectric layer on the recessed first interlayer dielectric layer, wherein the first interlayer dielectric layer is denser than the sacrificial dielectric layer;

removing the sacrificial dielectric layer to expose a portion of the first CESL; and removing the exposed portion of the first CESL to expose a portion of the source/drain region.

16. The method of claim 15, further comprising forming a silicide layer on the exposed portion of the source/drain region.

17. The method of claim 16, further comprising depositing a second CESL on the silicide layer and a second interlayer dielectric layer on the second CESL.

18. The method of claim 15, wherein the first CESL interfaces the source/drain region.

19. The method of claim 18, wherein the first interlayer dielectric layer interfaces the first CESL.

20. The method of claim 19, wherein the second CESL interfaces the first interlayer dielectric layer.

* * * * *